(12) United States Patent
Keatch et al.

(10) Patent No.: US 12,076,720 B2
(45) Date of Patent: Sep. 3, 2024

(54) FLUID CONTROL

(71) Applicant: LumiraDx UK Ltd., London (GB)

(72) Inventors: Steven Alexander Keatch, Stirling (GB); Phill Lowe, Stirling (GB); Brian McGuigan, Stirling (GB); Andrew Peter Phelan, Cheltenham (GB); Aman Khan, Bedford (GB)

(73) Assignee: LumiraDx UK Ltd., London (GB)

( * ) Notice: Subject to any disclaimer, the term of this patent is extended or adjusted under 35 U.S.C. 154(b) by 450 days.

(21) Appl. No.: 17/228,402

(22) Filed: Apr. 12, 2021

(65) Prior Publication Data

US 2021/0402388 A1 Dec. 30, 2021

Related U.S. Application Data

(63) Continuation of application No. 16/313,633, filed as application No. PCT/GB2017/051946 on Jun. 30, 2017, now Pat. No. 11,000,847.

(30) Foreign Application Priority Data

Jun. 30, 2016 (GB) ...................... 1611442

(51) Int. Cl.
*B01L 3/00* (2006.01)
*F04B 13/00* (2006.01)
(Continued)

(52) U.S. Cl.
CPC ..... *B01L 3/50273* (2013.01); *B01L 3/502723* (2013.01); *F04B 13/00* (2013.01);
(Continued)

(58) Field of Classification Search
CPC ..... B01L 2200/0668; B01L 2200/0684; B01L 2200/16; B01L 2300/0645;
(Continued)

(56) References Cited

U.S. PATENT DOCUMENTS 4,098,876 A 7/1978 Piasio et al.
4,772,550 A 9/1988 Greenquist
(Continued)

FOREIGN PATENT DOCUMENTS

CA 1165671 A 4/1984
CA 2693636 A1 1/2009
(Continued)

OTHER PUBLICATIONS

"Electrochemical Sensors, Biosensors and Their Biomedical Applications," Edited by Xueji Zhang et al. (2008), Chapter 11 "Biochips—fundamentals and applications" (100 pages).
(Continued)

*Primary Examiner* — Jennifer Wecker
(74) *Attorney, Agent, or Firm* — Goodwin Procter LLP

(57) ABSTRACT

The present invention relates to a microfluidic assay system and associated reading device, as well as the individual components themselves. The present invention also relates to methods of conducting assays, using a disposable system and associated reading device, as well as kits for conducting assays.

19 Claims, 15 Drawing Sheets

(51) Int. Cl.
| | |
|---|---|
| *F04B 35/01* | (2006.01) |
| *F04B 43/04* | (2006.01) |
| *F04B 45/067* | (2006.01) |
| *F04B 45/08* | (2006.01) |
| *F04F 1/02* | (2006.01) |
| *F04F 1/10* | (2006.01) |
| *H10N 30/20* | (2023.01) |

(52) U.S. Cl.
CPC ............ *F04B 35/01* (2013.01); *F04B 43/046* (2013.01); *F04B 45/067* (2013.01); *F04B 45/08* (2013.01); *F04F 1/02* (2013.01); *F04F 1/10* (2013.01); *H10N 30/2042* (2023.02); *B01L 2200/0668* (2013.01); *B01L 2200/0684* (2013.01); *B01L 2200/16* (2013.01); *B01L 2300/0645* (2013.01); *B01L 2300/0816* (2013.01); *B01L 2300/0864* (2013.01); *B01L 2300/0887* (2013.01); *B01L 2300/123* (2013.01); *B01L 2400/0406* (2013.01); *B01L 2400/0481* (2013.01); *B01L 2400/0484* (2013.01); *B01L 2400/0487* (2013.01); *B01L 2400/0688* (2013.01); *B01L 2400/0694* (2013.01)

(58) Field of Classification Search
CPC ..... B01L 2300/0816; B01L 2300/0864; B01L 2300/0887; B01L 2300/123; B01L 2400/0406; B01L 2400/0481; B01L 2400/0484; B01L 2400/0487; B01L 2400/0688; B01L 2400/0694; B01L 3/502723; B01L 3/50273; F04B 13/00; F04B 35/01; F04B 43/046; F04B 45/067; F04B 45/08; F04F 1/02; F04F 1/10; H10N 30/2042

See application file for complete search history.

(56) References Cited

U.S. PATENT DOCUMENTS

| | | | |
|---|---|---|---|
| 4,806,313 | A | 2/1989 | Ebersole et al. |
| 5,096,669 | A | 3/1992 | Lauks et al. |
| 5,145,784 | A | 9/1992 | Cox et al. |
| 5,674,681 | A | 10/1997 | Rothenberg |
| 5,698,448 | A | 12/1997 | Soldin |
| 5,821,399 | A | 10/1998 | Zelin |
| 5,842,787 | A | 12/1998 | Kopf-Sill et al. |
| 5,866,345 | A | 2/1999 | Wilding et al. |
| 5,932,100 | A | 8/1999 | Yager et al. |
| 5,939,272 | A | 8/1999 | Buechler et al. |
| 5,957,579 | A | 9/1999 | Kopf-Sill et al. |
| 6,225,043 | B1 | 5/2001 | Abuknesha |
| 6,299,757 | B1 | 10/2001 | Feldman et al. |
| 6,395,232 | B1 | 5/2002 | McBride |
| 6,448,090 | B1 | 9/2002 | McBride |
| 6,982,146 | B1 | 1/2006 | Schneider et al. |
| 7,172,897 | B2 | 2/2007 | Blackburn et al. |
| 7,238,324 | B2 | 7/2007 | Ko et al. |
| 8,435,738 | B2 | 5/2013 | Holmes |
| 8,506,898 | B2 | 8/2013 | Perez |
| 8,512,648 | B2 | 8/2013 | Bau-Madsen |
| 9,149,807 | B2 | 10/2015 | Niggel et al. |
| 9,233,370 | B2 | 1/2016 | Miller et al. |
| 9,341,620 | B2 | 5/2016 | Lowe et al. |
| 9,919,313 | B2 | 3/2018 | Lowe et al. |
| 10,261,077 | B2 | 4/2019 | Lowe et al. |
| 10,376,881 | B2 | 8/2019 | Lowe et al. |
| 11,000,847 | B2 | 5/2021 | Keatch et al. |
| 11,278,886 | B2 | 3/2022 | Lowe et al. |
| 11,400,449 | B2 | 8/2022 | Bau-Madsen et al. |
| 2002/0142471 | A1 | 10/2002 | Handique et al. |
| 2003/0040129 | A1 | 2/2003 | Shah |
| 2003/0170881 | A1 | 9/2003 | Davis et al. |
| 2003/0175947 | A1 | 9/2003 | Liu et al. |
| 2003/0224775 | A1 | 12/2003 | Suda et al. |
| 2003/0233827 | A1 | 12/2003 | Kuo et al. |
| 2004/0005247 | A1 | 1/2004 | Karp |
| 2004/0086427 | A1 | 5/2004 | Childers et al. |
| 2004/0151629 | A1 | 8/2004 | Pease et al. |
| 2004/0189311 | A1 | 9/2004 | Glezer et al. |
| 2004/0237674 | A1 | 12/2004 | Wu et al. |
| 2005/0010133 | A1 | 1/2005 | Pestes et al. |
| 2005/0030033 | A1 | 2/2005 | Peck et al. |
| 2005/0041525 | A1 | 2/2005 | Pugia et al. |
| 2005/0054078 | A1 | 3/2005 | Miller et al. |
| 2005/0170490 | A1* | 8/2005 | Chen .................... B29C 66/543 435/287.1 |
| 2006/0257958 | A1 | 11/2006 | Bruno |
| 2007/0031283 | A1 | 2/2007 | Davis et al. |
| 2007/0037225 | A1 | 2/2007 | Metzger et al. |
| 2007/0292941 | A1* | 12/2007 | Handique .......... B01L 3/502715 435/287.1 |
| 2008/0025872 | A1 | 1/2008 | Dykes et al. |
| 2008/0199893 | A1 | 8/2008 | Neubert et al. |
| 2008/0318798 | A1 | 12/2008 | Campbell et al. |
| 2009/0130658 | A1 | 5/2009 | Barlag et al. |
| 2009/0130771 | A1 | 5/2009 | Davies et al. |
| 2009/0263891 | A1 | 10/2009 | Gillies et al. |
| 2009/0298059 | A1 | 12/2009 | Gumbrecht et al. |
| 2009/0325276 | A1 | 12/2009 | Battrell et al. |
| 2010/0009431 | A1 | 1/2010 | Cho et al. |
| 2010/0075311 | A1 | 3/2010 | Barrault et al. |
| 2011/0067489 | A1 | 3/2011 | Haberstroh |
| 2012/0031773 | A1 | 2/2012 | Miller |
| 2012/0071342 | A1 | 3/2012 | Lochhead et al. |
| 2012/0270225 | A1 | 10/2012 | Wakeley et al. |
| 2013/0162981 | A1 | 6/2013 | Emeric et al. |
| 2013/0224775 | A1 | 8/2013 | Davis et al. |
| 2013/0299003 | A1 | 11/2013 | Beebe et al. |
| 2014/0194305 | A1 | 7/2014 | Kayyem et al. |
| 2014/0212882 | A1 | 7/2014 | Handique et al. |
| 2015/0004680 | A1 | 1/2015 | Song et al. |
| 2015/0024426 | A1 | 1/2015 | De Oliveira Garcia Da Fonseca et al. |
| 2015/0087079 | A1 | 3/2015 | Coffey et al. |
| 2015/0167052 | A1 | 6/2015 | Griffin et al. |
| 2016/0175836 | A1 | 6/2016 | Taylor et al. |
| 2016/0320374 | A1 | 11/2016 | Lowe et al. |
| 2017/0227536 | A1 | 8/2017 | Matsuura |
| 2018/0364143 | A1 | 12/2018 | Al Ahmad |
| 2021/0402388 | A1 | 12/2021 | Keatch et al. |
| 2022/0193672 | A1 | 6/2022 | Lowe et al. |

FOREIGN PATENT DOCUMENTS

| | | |
|---|---|---|
| CN | 101553729 A | 10/2009 |
| CN | 201596509 U | 10/2010 |
| CN | 105813751 A | 7/2016 |
| DE | 102004046366 A1 | 2/2006 |
| DE | 102012018029 A1 | 3/2014 |
| EA | 030531 U1 | 7/2003 |
| EP | 2673643 A1 | 12/2013 |
| EP | 2613881 B1 | 12/2018 |
| EP | 2875866 B1 | 1/2020 |
| GB | 2436616 A | 10/2007 |
| GB | 2443694 A | 5/2008 |
| JP | H10-132712 A | 5/1998 |
| JP | 2001194373 A | 7/2001 |
| JP | 2004-301767 A | 10/2004 |
| JP | 2006377221 | 1/2006 |
| JP | 2007-500510 A | 1/2007 |
| JP | 2007-333706 A | 12/2007 |
| JP | 2009540326 A | 11/2009 |
| JP | 2010509581 A | 3/2010 |
| JP | 2010-117308 A | 5/2010 |
| JP | 2014-224679 A | 12/2014 |
| RU | 2125267 C1 | 1/1999 |
| RU | 2640501 C2 | 1/2018 |
| RU | 2697877 C2 | 8/2019 |
| TW | I247884 B | 1/2006 |
| WO | WO-94/25876 A1 | 11/1994 |

(56) References Cited

FOREIGN PATENT DOCUMENTS

| | | |
|---|---|---|
| WO | WO-2003/049860 A1 | 6/2003 |
| WO | WO-2004/009226 A1 | 1/2004 |
| WO | WO-2004/011925 A1 | 2/2004 |
| WO | WO-2004/061418 A2 | 7/2004 |
| WO | WO-2005/030033 A2 | 4/2005 |
| WO | WO-2005/078436 A1 | 8/2005 |
| WO | WO-2006/022495 A1 | 3/2006 |
| WO | WO-2006074665 A2 | 7/2006 |
| WO | WO-2006/105110 A2 | 10/2006 |
| WO | WO-2007/089753 A2 | 8/2007 |
| WO | WO-2007/110779 A2 | 10/2007 |
| WO | WO-2008/007242 A2 | 1/2008 |
| WO | WO-2008/056165 A1 | 5/2008 |
| WO | WO-2009/108260 A2 | 9/2009 |
| WO | WO-2009/115608 A2 | 9/2009 |
| WO | WO-2011/123064 A1 | 10/2011 |
| WO | WO-2012/129455 A2 | 9/2012 |
| WO | WO-2013/096801 A1 | 6/2013 |
| WO | WO-2013/096817 A2 | 6/2013 |
| WO | WO-2013/142847 A1 | 9/2013 |
| WO | WO-2013/154946 A1 | 10/2013 |
| WO | WO-2013/174762 A1 | 11/2013 |
| WO | WO-2014/049116 A1 | 4/2014 |
| WO | WO-2014052590 A1 | 4/2014 |
| WO | WO-2015/015178 A2 | 2/2015 |
| WO | WO-2015/084458 A2 | 6/2015 |
| WO | WO-2015193076 A1 | 12/2015 |
| WO | WO-2016/018910 A1 | 2/2016 |
| WO | WO-2016065297 A1 | 4/2016 |
| WO | WO-2017/015172 A1 | 1/2017 |
| WO | WO-2018/002668 A1 | 1/2018 |
| WO | WO-2019/083825 A1 | 5/2019 |
| WO | WO-2021146350 A2 | 7/2021 |

OTHER PUBLICATIONS

Bange, Adam, et al., "Microfluidic Immunosensor Systems", 2005, Biosensors and Bioelectronics, No. 20, pp. 2488-2503.

Chapter 11, (2008), "Biochips—Fundamentals and Applications," Electrochemical Sensors, Biosensors and Their Biomedical Applications, Xueji Zhang et al.(Eds) (100 pages).

EP Search Report for EP19215736, dated Sep. 29, 2020, 8 pages.

International Preliminary Report and Written Opinion for PCT/GB2017/051946 dated Jan. 1, 2019 (23 pages).

International Search Report and Written Opinion for International Patent Application No. PCT/GB2017/051946, dated Dec. 6, 2017 (33 pages).

International Search Report for PCT/GB2011/001315 dated Dec. 13, 2011 (4 pages).

Kurita, Ryoji, et al., "On-Chip Enzyme Immunoassay of a Cardiac Marker Using a Microfluidic Device Combined with a Portable Surface Plasmon Resonance System", 2006, Anal. Chem., No. 78, pp. 5525-5531.

Lim, C.T., et al., "Bead-Based Microfluidic Immunoassays: The Next Generation", 2007, Biosensors and Bioelectronics, No. 22, pp. 1197-1204.

Liu, H.-B. et al. (2012) "Manipulating liquid plugs in microchannel with controllable air vent," Biomicrofluidics, 6: 012815.

Meagher, Robert J., et al., "An Integrated Microfluidic Platform for Sensitive and Rapid Detection of Biological Toxins", 2008, Lab. Chip, No. 8, pp. 2046-2053.

PCT Search Report and Written Opinion for PCT/GB2011/001315, completed Dec. 13, 2012.

PCT Search Report and Written Opinion for PCT/GB2012/000122, completed May 24, 2012.

Peoples, Michael C., et al., "Microfluidic Immunoaffinity Separations for Bioanalysis", 2008, Journal of Chromatography, No. 866, pp. 14-25.

RU Search Report for RU2019102399 and English translation, dated May 21, 2020, 4 pages.

Search Report (Great Britain) prepared for Application No. GB1611442.3 dated Dec. 23, 2016, 4 pages.

Search Report (Great Britain) prepared for Application No. GB1611442.3 dated Mar. 6, 2017, 3 pages.

Wang et al. (2007) "Microsystem design and production," p. 597-602 with English translation of p. 599, paragraph 2 (8 pages).

International Search Report and Written Opinion for International Application No. PCT/US2021/013325 mailed Oct. 8, 2021, 29 pages.

International Search Report and Written Opinion for International Application No. PCT/GB2021/052910 mailed on Apr. 12, 2022, 17 pages.

Dijkink et al, "The 'acoustic scallop': a bubble-powered actuator", J. Micromech. Microeng. 16 (2006) 1653-1659.

Tovar et al., 12th International Conference on Miniaturized Systems for Chemistry and Life Sciences, Oct. 12-16, 2008, San Diego, CA, USA p. 1384.

Lee et al., "Microfluidic Air-Liquid Cavity Acoustic Transducers for On-Chip Integration of Sample Preparation and Sample Detection", Journal of the Association for Laboratory Automation, vol. 15, Issue 6, Dec. 2010, pp. 449-454.

Tovar et al., "Lateral air cavities for microfluidic pumping with the use of acoustic energy", Microfluid Nanofluid (2011) 10:1269-1278.

Bisson, "A Microanalytical Device for the Assessment of Coagulation Parameters in Whole Blood", Solid-State Sensors, Actuators, and Microsystems, Workshop Hilton Head Island, South Carolina, Jun. 8-11, 1998.

Liu et al., "Bubble-induced Acoustic Micromixing", Lab on a Chip, Sep. 2002, 2(3):151-7.

* cited by examiner

SECTION A-A

20mm wide
6 Across Web,
2 Assays

30mm wide
4 Across Web,
4 Assays

60mm wide
2 Across Web,
10 Assays

FLUID CONTROL

This application is a continuation of U.S. application Ser. No. 16/313,633, filed on Dec. 27, 2018, which is the National Stage application under 35 U.S.C. § 371 of PCT International Application No. PCT/GB2017/051946, filed on Jun. 30, 2017, which claims priority to and the benefit of United Kingdom patent application No. 1611442.3, filed Jun. 30, 2016, the entire disclosure of each of which is incorporated herein by reference for all purposes.

FIELD OF THE INVENTION

The present invention relates to a microfluidic assay system and associated reading device, as well as the individual components themselves. The present invention also relates to methods of conducting assays, using a disposable system and associated reading device, as well as kits for conducting assays.

BACKGROUND TO THE INVENTION

Microfluidic cartridges are routinely used for carrying out a variety of assays, both biological and chemical and/or physiochemical and the results of the assays are often determined using an associated reader device into which the cartridge has been introduced.

Fluid movement within the cartridge is often required in order to ensure that a sample is able to contact reagents which are deposited within the cartridge and which are capable of reacting with one or more target analytes which may be present in a sample. Following reaction with one or more reagents, it is often desirable for the sample to be removed from the area where the reaction has taken place, in order that a further reaction can occur, or simply to allow the detection of any reaction product, which can be difficult to achieve when the sample remains in place, due to optical interference for example.

Fluid movement within the cartridge may occur by capillary action alone, or control of fluid within the cartridge may be effected by an active force provided, for example, by the use of micro pumps and valves which may be present in the cartridge, or by way of mechanisms present in the reader device which are designed to interact with the cartridge and pump a fluid into and/or out of the cartridge in order to control fluid movement within the cartridge itself—see for example EP2613881. Alternatively a combination of capillary action and an active force may be used.

U.S. Pat. No. 7,238,324, for example, describes a microfluidic device which employs both capillary action and the application of an external pump. A sample is allowed to enter the microfluidic cartridge through a first port by capillary action and flows to a sensing chamber where the assay occurs. Following the assay reaction, liquid is introduced into the chip through a second port by use of an external pump. The purpose of this liquid is to wash away the original sample, leaving only the reaction products behind which can be detected. However, this means that a separate liquid must be introduced to the chip from the outside and through a further port, which could become clogged and/or subject to contamination. Moreover, the liquid may become contaminated or degrade over time. Thus, there is a need to provide microfluidic cartridges in which it is not necessary to introduce fluids, other than the sample, from outside the cartridge and/or have ports, other than the sample port through which the sample is to be introduced. Some designs are known to include liquid filled pouches within the cartridge itself in order to provide suitable wash reagents/buffers etc, but this significantly increases the complexity and expense of the cartridges and the liquid reagents may also be susceptible to degradation.

U.S. Pat. No. 5,821,399 describes a system and cartridge employing electrical conductivity to measure samples and fluid between samples. Rinse fluid is provided in a fluid filled pouch within the cartridge, which can be transported within the cartridge and detected by its electrical conductivity by the reader. The difference in electrical conductivity between a sample and the rinse fluid or air segment can easily be determined.

WO2013154946 describes a microfluidic system which uses a combination of capillary action and gas pressure to control the movement of liquid samples within a microfluidic device. Initially a liquid sample which is introduced into the device is transported by capillary action partly along a capillary channel. As the liquid advances the gas pressure at the distal gas-liquid interface increases by an amount sufficient to stop the movement of the liquid. To initiate further movement of the liquid sample, a pump connected to a distal portion of the capillary channel decreases the pressure of the gas acting upon the distal gas-liquid interface of the liquid sample by an amount sufficient to permit the liquid sample to move by capillary action further along the capillary channel of the microfluidic device.

U.S. Pat. No. 5,096,669 describes a disposable device for use in conjunction with a reader device. A sample may be initially drawn into the disposable device by way of capillary action and further movement of the sample within the device may be effected by the reader automatically depressing a gas bladder comprising a flexible membrane, within the device, so as to cause the fluid sample to flow over sensors and the concentration of a chemical species to be determined.

WO2013/096801 describes a lateral flow detection system, which can include fluidic features. In one embodiment, there is described a cartridge which includes the lateral flow device which includes chromatographic media and immobilised antibodies, but further includes a gas bladder which is actuated by a pump within the reader. Depression of the gas bladder serves to move the fluid sample within the fluidic channels of the cartridge and into the capture zone. Following appropriate capture the fluid sample is further pushed by action on the gas bladder, into a wash chamber. The use of a wash fluid is described to flush away components of the sample fluid, such as red blood cells, which may interfere with detection. However, combining lateral flow features with microfluidic features provides a degree of complexity and lateral flow tests are generally for qualitative or semi-quantitative measurement, rather than being quantitative.

EP2613881, an earlier application from the current applicant, describes a microfluidic cartridge and associated reader. A fluid port within the cartridge is designed to form a fluid-tight seal with the reader such that gas may be transported within and throughout the cartridge by the reader.

WO03/049860 describes a complex device for chemical or biochemical analysis, comprising first and second layers separated by a frangible third layer. Upon breaking the frangible third layer, fluid present in the second layer is able to enter the fluidic network of the first layer. Many chambers are provided which have to be sequentially compressed in order to provide various reagents and conduct any particular assay.

US2015/0004680 describes biosensor cartridges for detecting one or more components in a sample. Each cartridge comprises as well as microfluidic channels, an air pump chamber and a reagent pump chamber which comprise pores on their upper surface. When an associated sensor employs optical detection, wash buffers are also provided in the cartridge. The chambers are described as separate pouches which are inserted within recesses of the cartridge. The reagent and buffer pouches are filled with suitable liquid.

There is also a need to be able to test fluid, such as blood samples, from subjects more quickly and with less complexity. There is even the desire for subjects to be able to test themselves at home.

Typically when a subject presents at a local medical clinic or even at a hospital, relatively large samples of fluid or blood are taken to be analysed and depending on the tests carried out, a number of separate vials or samples may be required. Also, where the test is not carried out at the time of sample collection, it is often necessary to store the sample in a manner which minimises degradation or loss of a particular analyte to be detected. Some tests are time sensitive and the time taken to conduct a test can result in the disease progressing undesirably, when the subject could have been being treated.

There are also diseases and conditions where it would be desirable for the subject to be able to test themselves on a regular basis and be able to self-medicate on the basis of the test results. In this manner the subject can be directed on the basis of a test result, possibly with input from a healthcare worker, as to the medication which should be taken.

Moreover, clinical analysis of samples has traditionally been conducted using clinical analytical techniques which require the use of specialist laboratories with large scale machines for carrying out the analyses. Over the last few years, there has been a drive to develop benchtop sized or even handheld devices which are capable of conducting such tests. However, the ability of such devices to be able to handle only small sample volumes and/or carry out a variety of different types of analyses is limited. Moreover, it would be desirable if a single reader were able to carry out a variety of different panels of tests, such that the user does not have to have a number of different readers in order to be able to conduct different types of tests.

U.S. Pat. No. 8,435,738, for example, describes a modular system which is capable of conducting a number of assays from a single blood sample. However, it is clear that individual and separate modules are provided to carry out different functions and the sample is transported to each module by way of a sample handling system. It also appears that the system comprises a housing which is designed to handle the sample preparation as well as carry out the various assays, but it is unclear what happens to each sample once it has been analysed.

SUMMARY OF THE INVENTION

The present invention is based in part on studies by the present inventors into controlling the movement of a liquid sample within a microfluidic cartridge and also how to effectively remove the sample and/or wash bound components from an analyte detection zone within the cartridge, without having to introduce a fluid from outside the cartridge, or to use a wash or other liquid(s) which would be present in the cartridge or associated reader. The inventors have developed a "dry" microfluidic cartridge which includes a gas filled chamber which can be used to facilitate very accurate controlled movement of the liquid sample within the cartridge and to remove the sample and unbound material from an analyte detection zone within the cartridge, such that any detectable elements which may include complexes which comprise the analyte or analyte reaction product can be detected in a gas environment. Importantly the cartridges of the present invention do not require additional liquids, other than the sample itself, to be present in the cartridge and/or introduced to the cartridge. There is further provided an associated reader device for use with the cartridge.

In one area the present invention teaches methods and cartridges which use only a gas, such as air within a chamber which is present in a microfluidic cartridge, to control movement of the liquid sample within the cartridge and also optionally to remove the liquid sample and unbound material from a detection area, prior to detection being carried out.

In another alternative and/or complimentary area the present invention provides cartridges, readers and methods for carrying out a multiplicity of different assays using a single cartridge and associated reader.

In a first aspect there is provided a self-contained microfluidic system for use in conducting an assay on a liquid sample, the microfluidic system comprising:

a sample input port for receiving the liquid sample, the sample input port connected to at least one microfluidic channel, wherein each/said microfluidic channel(s) comprises one or more reagents deposited therein for use in conducting the assay and a detection zone for use in detecting any analyte which may be present in a sample or analyte reaction product thereof; and each/said microfluidic channel(s) is further fluidly connected to a compressible, gas-filled chamber downstream from each/said detection zone, and wherein the system is formed from three layers, which are sandwiched together to define each/said microfluidic channel(s) and said gas filled chamber, and wherein compressing or decompressing said chamber causes gas to be expelled from or drawn into the chamber, which in turn causes movement of the liquid sample within said/each microfluidic channel.

Typically, although not exclusively, the system may be in the form of a cartridge, which is designed to be inserted into an associated reader device. For brevity, hereinafter reference will be made to the system being in the form of a cartridge, but this is not to be construed as limiting.

For the avoidance of doubt the present invention does not require the use of liquid-filled pouches to be present within or provided with the cartridge and/or the ability to transfer fluid (liquid or gas) from an associated reader to the cartridge. In this regard the cartridge of the present invention is to be considered as being self-contained. The cartridges of the present invention prior to application of a sample are substantially liquid free and may be considered as dry. The only fluid prior to application of the liquid sample, which may be, or is present in the cartridge, will be a gas, typically air. Advantageously the only liquid required in the assays of the present invention, is the liquid sample itself.

In certain embodiments said one or more reagents may be deposited in a first location within each/said microfluidic channel(s). In other embodiments said one or more reagents may be deposited in more than one location within each/said microfluidic channel(s). At least one of said one or more reagents may be deposited within the detection zone, or alternatively no reagents are deposited within the detection zone. The reagents may initially be provided in a liquid form which is allowed to dry by evaporation or other means. In terms of the present invention, when the/said reagents are initially presented in a liquid from, which is subsequently dried, the term "dry" is to be understood as meaning that less than 10%, 5%, or 1% of the initial liquid remains after drying.

In certain embodiments the detection zone may be downstream from where said one or more reagents have been deposited.

The term "downstream" in the context of the present invention is in reference to where the sample is applied to the system and the direction of flow of the sample.

Optionally following reaction of the liquid sample with said one or more reagents deposited within said/each microfluidic channel(s) and transfer of the sample and other reagents to the detection zone, gas expelled from the chamber optionally serves to remove liquid from the detection zone within the microfluidic channel, in order that any captured analyte or analyte reaction products within the detection zone can be detected in a substantially liquid free environment. Thus, in one embodiment, the present invention provides a cartridge and method wherein detection takes place in a substantially liquid free environment. Moreover, the inventors have observed that it is only necessary to displace the liquid from the detection zone, using a corresponding volume of gas from the chamber. Thus, it is not necessary to use a conventional wash step, which may employ significant volumes of a fluid or fluids, which is/are designed to prevent and/or minimise signal interference. Thus, advantageously the present invention uses a gas, in much lower volume, to remove liquid and material within the liquid from the analyte detection zone. This is quite different to what would be understood in terms of performing a conventional wash step.

The microfluidic cartridge may comprise a plurality of microfluidic channels, wherein all of the plurality of microfluidic channels are in fluid communication with a single sample input port. The sample port may be in communication with a microfluidic channel which splits into said plurality of microfluidic channels in accordance with the present invention. Each of said plurality of microfluidic channels may be in fluid communication with a respective gas filled chamber, or two or more microfluidic channels may be in fluid communication with a single gas filled chamber. In accordance with the present invention, each chamber may be separately or independently controlled, thereby permitting independent control of movement of the sample within an individual microfluidic channel, or may control movement of the sample in a plurality of said microfluidic channels at the same time. Other than being in fluid communication with one or more microfluidic channels in the cartridge, in some embodiments said gas filled chamber(s) do not connect with any other features which may be present in the microfluidic cartridge or associated reader. For example, the only opening/exit from the gas filled chamber may be the opening with said microfluidic channel(s). Thus, said gas filled chamber(s) may be sealed in terms of not having a valve, port or otherwise in communication with the outside of the cartridge. In one embodiment, the sample input port is connected to a first end of each/said microfluidic channel(s) and the second end of each/said microfluidic channel(s) is connected to the/said opening(s) of one or more of said gas filled chambers. In such an embodiment the gas filled chamber(s) can be considered to be downstream of the sample input port and at an opposite end of each/said microfluidic channel(s) to the sample input port.

Unless context dictates otherwise, the term "fluid communication" is understood to mean that a fluid, including a gas or a liquid, is able to be transported between the relevant parts.

Optionally the microfluidic cartridge may further comprise one or more sink features designed to receive fluid waste and/or excess liquid sample. For the avoidance of doubt, some embodiments of the present invention specifically exclude one or more sink features, which may be advantageous.

The cartridge design of the present invention may easily be adapted to carry out a number of different assays and hence can be considered as an assay platform for a variety of similar and/or different assays. The cartridge and channel(s) disposed therein may be formed in any manner of ways known to the skilled addressee, which may include photolithography, wet chemical etching, laser ablation, injection moulding, die-punching, embossing and printing techniques. In accordance with the first aspect of the invention, the cartridge and the channels and other features disposed therein, are formed by a sandwich of three separate substrates—a first, second and third substrate, such as a top and bottom substrate with a middle substrate disposed between the top and bottom substrates. The three layers may be sealed together by application of heat or the use of an adhesive. Moreover the middle layer may itself be in the form of an adhesive layer which is capable of adhering the top and bottom substrates.

In one embodiment, the three substrates are planar. Typically the first and third (e.g. top and bottom and optionally the second (e.g. middle) substrate are substantially uniform in nature. That is, the thickness of said substrate is uniform and does not vary across the surface of the substrate.

In a specific embodiment, the bottom substrate is adhered to the middle substrate which has channels already disposed therein. The reagents required to carry out the assay are deposited in their specific deposition zones onto the bottom substrate, and are held in place, once reconstituted by the sample, by the channel walls (formed by the middle adhesive layer) and prevented from spreading throughout the formed channel by features printed onto the bottom substrate, for example hydrophobic ink. In this way the reagents are prevented from spreading outside their deposition zone by features on all four sides. The reagents are then dried and the final top layer of substrate is adhered to the middle layer to produce the fully formed cartridges. Many other methods of deposition of assay reagents into the cartridge can be envisaged by those skilled in the art.

The cartridges of the present invention may be formed by a web or roll-to-roll process known in the art from a roll of flexible polymer film, plastic or metal foil.

Advantageously, the inventors have found that when the cartridge is formed from a sandwich of three separate planar substrates, it is not necessary for the top and bottom substrates of the cartridge to be of different thicknesses and/or to have portions of different thickness or formed from other materials. Thus, the top and bottom layers may have a uniform thickness and be formed from a single material. This simplifies the manufacture of the cartridges and the associated costs. The material used to form the top and optionally bottom layers may be flexible, but at channel and gas chamber dimensions it is fairly rigid, but somewhat resilient. Surprisingly, the substrate which forms the top and bottom surfaces, especially the top outer surface of the/each gas filled chamber may be resilient, even though the thickness of the top surface is uniform across the surface of the substrate.

The adhesive which may be used to seal the layers together may also combine to facilitate with the compressibility of each/said chamber. Thus, the compressible nature of the chamber may in part be due to the adhesive being resilient, as well as the top and optionally bottom substrate being resilient. Contrary to the prior art, the gas filled chambers of the present invention need not comprise a flexible membrane or sheet forming an outer surface of the chamber, which is made from a different material and/or is of a different thickness or flexibility as compared to the substrate employed to form the rest of the top and optionally bottom layer. Thus the top layer and optionally bottom layer is/are made from a single material of uniform thickness across the layer. Ideally the top and bottom layers are made of the same material and are of uniform thickness. This simplifies manufacture of the cartridges which is an important consideration in terms of cost.

The cartridge can be formed of any suitable material, such as polycarbonate, polyolefins, such as cyclic olefin copolymers (COCs), polyester, polystyrene, PMMA, etc. and the/each substrate may be formed of a single or plurality of material(s). In the embodiment comprising three substrates, the middle substrate comprises a pattern cut through the substrate, corresponding to certain features of the cartridge, such as said channel(s), gas filled chamber(s), waste sink and the like. By applying and sandwiching (such as by heat sealing, gluing, stapling and the like) appropriately cut top and bottom substrates, to sandwich the middle substrate between the top and bottom substrates, a cartridge can be provided in which channels and other features are disposed. Each layer may be provided separately and sandwiched together, or the three layers may be connected to one another and the sandwich formed by folding the layers on top of one another in order to form the cartridge. The top and/or bottom substrates may be formed from, or coated with a material which is different to the middle substrate and/or adhesive material applied to any of the substrates to facilitate the sticking together of the three substrates. Features in the top and/or bottom substrate may be designed to co-locate with features in a reader device (as will be discussed hereinafter), which may facilitate with correct location of the cartridge in the reader.

In a convenient embodiment the read out of the assays of the present invention are designed to be detected optically. In this regard an associated reader will include optical detection means, such as a spectrometer or fluorimeter, which is designed to detect electromagnetic radiation emitted from the detection area of the cartridge. For fluorescent detection the spectrometer or fluorimeter within the reader will detect fluorescence emitted from material within the detection zone. Thus, at least a portion of the first or third layers (e.g. top or bottom layers) of the cartridge which is designed to face towards the spectrometer or fluorimeter in the reader must be optically transmissible in an appropriate range of the electromagnetic radiation spectrum. In the case of fluorescence detection, the at least portion of the first or third (e.g. top or bottom) layer of the cartridge must be optically transmissible in the range encompassing an excitation wavelength and a detection wavelength. For example, the at least portion of the first and third (e.g. top or bottom) layer of the cartridge must be optically transmissible in the range 200-1200 nm When the first and third (e.g. top and/or bottom) layers are made from a single material, it will be appreciated that the entire first and third (e.g. top and/or bottom) layer will be optically transmissible and not just a portion thereof. However, ink and/or masks may be employed to prevent or minimise the electromagnetic radiation of appropriate wavelength from leaching or scattering outside the detection zone. In one embodiment a portion of the third (e.g. bottom) layer, which encompasses the detection zone or portion therefore may be coated with a material which is designed to maximise emission of any fluorescent signal towards the optical detection means of the reader.

The first and third (e.g. top and bottom) substrates may be connected by a hinge that permits the two substrates to fold adjacent to one another with the middle substrate being disposed in between. Alternatively hinges may be provided between the first and second (e.g. top and middle) substrates and the second and third (e.g. middle and bottom) substrates, so that the first, second and third (e.g. top, middle and bottom) substrates fold adjacent to one another and may be formed from a single sheet of substrate.

Importantly said gas filled chamber(s) is/are designed to collocate with a feature or features in the reader which are designed to contact an outer surface of said gas filled chamber(s) (i.e. the top and/or bottom substrates when in the form of the three substrate sandwich, which is to be provided to the reader in a substantially horizontal fashion) and be capable of controlling force, e.g. compression, to be applied to/removed from an outer surface of the chamber. Applying a force to the outer surface of the/each chamber causes the chamber to be deformed and gas within the chamber to be expelled from the chamber into a microfluidic channel. Conversely, a subsequent reduction in the force e.g. decompression, applied to the/each chamber causes the chamber to deform less and optionally return to a non-deformed state, such that gas is drawn back into the chamber from a microfluidic channel.

It will be appreciated that without application of a force, the gas filled chamber will typically comprise a maximum volume of gas. Upon application of force, gas will be expelled from the gas filled chamber, thus reducing the volume of gas within the chamber. A subsequent reduction in the force applied to the chamber will permit gas to be drawn back into the chamber, with a consequential increase in the volume of gas within the gas filled chamber.

The gas within each chamber is typically air, although other gases or mixtures of gases may be introduced. For example, if any of the reagents which are deposited within each/said microfluidic channel(s) are liable to oxidation or otherwise possess a shorter lifespan when present in air, the cartridge and associated channels and chambers may be filled with an inert gas such as nitrogen, or the like. Generally reference will be made to the gas being air, but this should not be construed as limiting.

Typically in use, the cartridge may be provided or inserted into the reader prior to sample application and a force applied to said/each chamber in order to expel gas from said/each chamber and into said/each microfluidic channel. The cartridge may be considered as "primed" for sample application.

A sample, such as a sample of blood, or any other liquid sample, may be introduced into the cartridge by way of the sample input port. The sample may be introduced directly by contacting the sample with the input port. Alternatively, the sample may first be collected using a sample collection means and such sample collection means, such as a dipstick, micropipette, capillary tube or the like, contacted or inserted with/into the sample input port in order that the sample may be introduced into the cartridge and microfluidic channel. In some embodiments, such as when carrying out nucleic acid analysis, it may be desirable to carry out any analysis in a closed system. Thus, the sample collection means designed to introduce the sample into the microfluidic cartridge may serve the dual purpose of introducing the sample and sealing the sample input port, once the sample collection means has been inserted into/contacted/with the sample input port.

Following the sample being contacted with/introduced into the sample input port of the cartridge, the sample may be initially drawn into the microfluidic channel by way of capillary action. Alternatively the sample may be actively drawn into the microfluidic channel by reducing the force applied to said/each chamber such that gas is drawn into the chamber which in turn draws the liquid sample into and along said/each microfluidic channel(s).

In one embodiment the liquid sample is initially drawn along a single microfluidic channel, which splits into a plurality of microfluidic channels, each of said plurality of channels being capable of carrying out one or more assays. In this manner a single sample may be provided which is in turn split into a number of portions or aliquots.

Once a sample has been introduced into the cartridge and said/each microfluidic channel(s), such as by way of capillary action and/or actively drawing the sample through the cartridge, further fluid transport within and throughout the cartridge and associated channel(s) is carefully controlled/facilitated by way of controlled pressure as applied to said/each gas chamber which causes gas being introduced and/or expelled from said/each gas filled chamber(s). Gas which is drawn back into said/each chamber will typically serve to draw a liquid sample along said/each microfluidic channel(s) towards said/each chamber because of a vacuum effect and gas expelled from said/each chamber will push liquid within said/each microfluidic channel away from said/each chamber, towards the input port and optionally into the fluid waste sink, when present.

As mentioned above, a sink feature is entirely optional. In accordance with the present invention it is possible through appropriate fluid control and gas chamber management to ensure that once a sample is introduced into the cartridge, the sample or other liquid cannot be expelled from the sample port. Prior to sample application each/said chamber may be compressed to a maximum extent such that it is not possible to expel the sample from the sample input port. Advantageously compression of each/said gas filled chamber prior to sample application means that following conducting any assay and releasing any compression pressure on each/said gas filled chamber, the liquid sample is drawn further into the cartridge and possibly into the gas filled chamber, away from the sample input port. This may be seen as a useful safety feature, in terms of isolating any sample, following assaying, from the user.

Fluidic movement can be very accurately controlled by force control means in the reader. Moreover, the position of fluid within each channel can optionally be detected by the reader by means, such as electrodes, positioned along the microfluidic channels that are in contact with the reader and can feedback the position of any liquid and/or fluid in each/said microfluidic channel thereby permitting the reader to very carefully determine the position and/or rate of fluid movement through application of force/pressure to the gas/air filled chamber.

As identified, in use, the sample is applied to the cartridge through a sample input port such as by way of direct contact by the subject/patient or other means, for example, a pipette, capillary tube or the like. In a preferred embodiment the sample input port is an aperture in a side or face (e.g. top face) of the cartridge. Desirably the cartridge may be in the form of a generally thin planar device comprising top and bottom faces and four edges. In this arrangement, the sample input port may be formed in one of the edges of the cartridge or on the top face, so that a user need only contact the sample with the aperture formed in the edge or on the top face, in order to enable sample uptake into the cartridge. In use the user contacts the fluid sample with the port/aperture and, in certain embodiments, due to the dimensions of said channel(s) within the cartridge, fluid is drawn into the cartridge by capillary action. The dimensions of the sample port/aperture may be smaller than the dimensions of the channel(s). Thus, when expelling fluid from said/each microfluidic channel an optional fluid waste sink offers a large void area into which waste fluid sample and any unreacted reagents/label may be directed towards and into the waste sink, rather than out through the sample input port.

In certain embodiments a waste sink is not provided. As it is not necessary to remove the sample, or only necessary to remove the sample and unreacted reagents/label from the detection zone within said/each microfluidic channel. Careful control of fluid movement can be effected, such that gas expelled from said/each gas filled chamber is sufficient to simply remove the sample and any unreacted/unwanted reagents/label away from the detection zone. Initial maximum compression of the/said gas filled chamber, prior to liquid sample application, ensures that it is not possible to push the sample beyond the sample input port. Such careful control of fluid movement within the microfluidic channel means that a waste sink and/or large volumes of a wash fluid may not be required, resulting in a simplification in manufacture/use and a cost saving.

Said microfluidic channel(s) in the cartridge may also comprise one or more fluid stop features, which are designed to prevent the sample from passing through the stop feature, by virtue of capillary action alone. That is, the sample must be actively forced past said stop feature(s) and/or further along said microfluidic channel(s) by action of a force, such as the compression and/or decompression force acting upon the gas filled chamber, which serves to draw or push the liquid sample within the cartridge. The stop feature may be a hydrophobic material (e.g. printable conductive or non-conductive ink) or a process or material that changes the surface properties of a channel surface therefore creating a hydrophilic/hydrophobic differential (e.g. by way of laser ablation, surface scoring, surface material removal, evaporated metallic materials etc), which is designed to abut/be a wall feature or is coated on a wall (e.g. top, side(s) and/or bottom) of a channel. In an embodiment where the channels are formed by virtue of three substrates being sandwiched together thereby forming the channels, the hydrophobic material may be applied to the top and/or bottom substrates, such that when the three substrates are sandwiched together, the hydrophobic stop material forms a feature on the top and/or bottom surface of said channel (the walls of which are formed by the middle layer). Alternatively or additionally a small one way vent may be provided adjacent to or within the channel, which vent is capable of permitting air to be vented to outside the cartridge or to a void within the cartridge, but does not permit air or liquids to enter said microfluidic channel(s). Liquid entering the cartridge by capillary action will fill to the vent but not beyond it, without an additional force being applied.

In an embodiment where multiple channels are provided in order to carry out separate and/or repetitive assays, a fluid stop feature may be provided in each channel downstream from the sample input port. In this manner a sample would initially enter the cartridge through the sample input port, but be prevented from filling the length of each microfluidic channel by a fluid stop feature. In order to start each assay, the sample must be actively drawn past the fluid stop and along each microfluidic channel in order to contact said one or more reagents, by drawing gas back into said/each gas chamber. Advantageously this ensures that each assay may be started at the same time or at different times as required and also serves to minimize issues which may arise due to sample differences, such as blood haematocrit values and hence viscosity difference for example.

It is also preferred that a stop feature be located upstream of the fluid waste sink, when present, in order that the sample, upon initial application, does not flow into the waste chamber. When a sufficient force is applied to said/each gas filled chamber in order to actively push the liquid sample within said/each channel(s), liquid can pass the stop feature upstream of the fluid waste sink and enter into the waste sink. This stop feature can also be designed in such a way that although it prevents fluid entering the sink on initial contact, the sample can eventually wet over this stop feature and flow into the sink but only once the sample has filled the sample channels. Once these channels are full the capillary force on the stop feature increases and the excess sample can flow over the stop feature and into the sink. In this way the sink can act as an overflow for excess sample application and the fluid stop feature can act as a timing gate, controlling this liquid movement. In other embodiments this stop feature is not required. The sink can be filled with sample and act as a reservoir that the sample can be drawn from by reduction of force on the gas filled chamber(s) in order to transfer this sample from the sink into the sample channel(s).

In an embodiment, the waste sink is designed to be a void area of the cartridge into which spent fluid/sample or fluid which is not required or deemed undesirable, may be evacuated. For example, whole blood contains many proteins and other agents which can interfere with assay reactions and/or detection of captured analyte by way of fluorescence detection, for example. The present invention allows the initial binding and/or reaction of any analyte to be carried out within the sample (e.g. whole blood), but all or substantially all of the unbound material present in the liquid sample and the remaining liquid following reaction can subsequently be evacuated from the detection zone, optionally to the waste chamber, enabling further reactions and/or detection to be carried out in a substantially liquid free or gaseous environment.

However, as mentioned above, it may not be necessary to include a waste sink. Advantageously, the present inventors have observed that gas which is expelled from said/each gas chamber upon application of a force to said/each gas chamber, is sufficient to push/transport the liquid sample and unbound/unreacted material away from the detection zone. Thus, only captured, bound or immobilised material is retained in the detection zone in a substantially liquid free environment, and advantageously detection of any such material is easily conducted.

As well as each/said microfluidic channel(s), the cartridge of the present invention may comprise one or more electrode features which contact with said channel(s) and hence the sample once introduced into the cartridge. The electrodes are designed to contact electrical contacts within the reader, enabling a variety of readings to be taken, where appropriate. For example, one or more electrodes in the cartridge may be designed to detect correct loading of the cartridge and the reader may signal to the user whether or not the cartridge has a) been correctly inserted into the reader and/or b) the sample loaded into the cartridge correctly, for example to a fluid stop feature. The electrode(s) may also carry out one or more electrical measurements on the sample itself. For example, when the sample is a sample of whole blood, the electrode(s) may conduct a haematocrit measurement of the sample, which may be important in determining an accurate concentration of the analyte to be detected. Conductivity and/or impedance measurements may be determined depending on the sample being studied. Thus, the cartridges of the present invention may not only detect whether or not an analyte is present in a sample by way of binding/reacting with any analyte, but electrical measurements on the sample may also be conducted. The electrode(s) may also be used to confirm that the removal of the sample from the detection area, by gas expelled from the gas filled chamber, has correctly occurred, as there will be a significant change in conductivity being detected when a liquid is present or absent. Electrodes may also be provided to the gas filled chamber in order to signal the degree of compression of each/said chamber.

The sample to be applied to the cartridge may be any suitable liquid sample. It may for example be a sample of fluid obtained from a subject, such as a whole blood, plasma, saliva, semen, sweat, serum, menses, amniotic fluid, tears, a tissue swab, urine, cerebrospinal fluid, mucous sample and the like. It is to be appreciated that the assay systems of the present invention may be applied in the human health area, including large and growing IVD markets (e.g. cancer, cardiology, drugs of abuse detection and infectious disease, including bacterial, fungal and viral infections). The assays may also be used to test drugs and drug action. However, the system may also be applied in environmental settings where it is desirable to detect, for example toxic agents or infectious agents such as bacteria, fungi or viruses. Thus, samples from rivers or lakes or swabs from solid surfaces may be taken in order to obtain a liquid sample for providing to the cartridge. The assay systems may also be utilised for veterinary applications. Essentially any assay in which a sample can be provided in a liquid form or rendered into a liquid form may be utilised in the present invention, e.g. a sample of breath can be obtained by blowing into a liquid and the liquid used in accordance with the invention. Swabs can also be taken of surfaces and placed within a liquid in order to provide a liquid sample The sample may, for instance, include materials obtained directly from a source, such as a sample of whole blood, as well as materials pre-treated using techniques, such as filtration, precipitation, dilution, distillation, mixing, concentration, inactivation of interfering agents, etc. These steps may be carried out prior to the sample being introduced to the cartridge or may be carried out by the cartridge itself.

The sample may be introduced prior to the cartridge being inserted into the reader device or after the cartridge has been inserted into the reader. In some embodiments, the cartridge will be inserted into the reader device before the sample is applied and a force applied to the gas filled chamber in order to expel gas from said/each chamber. This may effectively prime the cartridge to be ready for sample application. Reducing the force applied to said/each chamber will draw gas back into the chamber and in turn draw the sample into and along said/each microfluidic channel(s). The cartridge may also be designed such that the sample may be initially introduced by way of capillary action. In this manner a stop feature, as described above, may be provided to limit the sample ingress into said microfluidic channel(s). Further transport of the sample being as a result of the expelling or introduction of gas from/into said/each gas filled chamber(s). In order that the sample may initially be introduced by way of capillary action, it is necessary for gas, which is present in said microfluidic channel(s) to be displaced by the sample. This may be achieved by way of a valve or the like exiting from the microfluidic channel to outside of the cartridge. In one embodiment the valve is a one-way valve which is designed only to allow gas to exit the cartridge and not permit a gas or liquid from being introduced into the cartridge.

The valve may be a small hole or slit, for example, positioned adjacent to or in close proximity to a hydrophobic stop feature designed to prevent further transport of the sample within said/each microfluidic channel(s) by capillary action alone. Each valve may be in fluid communication with said/each microfluidic channel by way of a channel of smaller dimension than said/each microfluidic channel itself (such as less than 50%, 25% or 20% of the width of said/each microfluidic channel). In use, when the sample is removed from the detection zone, along said/each microfluidic channel, following the reaction process taking place, the sample is favourably directed towards the sample input port and/or fluid waste sink when present, rather than towards the valve, due to the dimensions of said/each microfluidic channel being larger than the channel which connects the microfluidic channel to the valve. Moreover, upon initial sample application, a small amount of the sample may fill the channel of smaller dimension and act as a barrier to further fluid flow between the valve and the microfluidic channel after sample application. Without being bound by theory it is expected that the barrier is caused by the relatively higher capillarity of the smaller channel as compared the/said larger main microfluidic channel. The small amount of sample may remain in the smaller channel and in effect seal off the valve following capillary fill. In this manner the valve only has an effect during initial capillary fill and thereafter liquid transport within the cartridge is effected or controlled by gas being drawn into or expelled from said/each chamber.

In a further aspect there is provided a valve system for use in accordance with the present invention, the valve system comprising:

a vent or slit opening in a top or bottom surface of an assay system according to the present invention; and a microfluidic channel of smaller dimension to the/said microfluidic channel of the assay system, which microfluidic channel of smaller dimension is in fluid communication with the vent or slip opening and the/said microfluidic channel of the assay system.

Conveniently the valve system is positioned so as to be adjacent to a capillary stop of the/said microfluidic channel, such that upon the sample being introduced to the assay system, the sample fills by capillary action to the capillary stop and a portion of the sample also at least partially fills the microchannel of smaller dimension. The portion of the sample at least partially filling the microchannel of smaller dimension acts as a barrier to further fluid transport along the microchannel of smaller dimension and fluid export through the vent or slit.

Desirably a cartridge of the present invention may be designed to conduct a plurality of assays (repetitions of the same assay and/or different assays) on a single liquid sample. The dimensions of the cartridge and associated channels are such that all such assays are ideally carried out from a liquid sample, such as a sample of blood obtainable by a finger prick, which is less than 100 µl, 50 µl, such as less than 40 µl, 30 µl or even 20 µl or less. In this manner it is possible to conduct an assay or assay within a single channel of a cartridge employing less than 10 µl, such as less than 7 µl, 5 µl, or even 2 µl or less, of liquid sample, such as blood. This is considerably less than required for analysis carried out in hospitals using larger benchtop analysers or other known point of care platforms.

The analyte to be detected can be any desired analyte and may include proteins, peptides, antibodies, nucleic acid, microorganisms (such as bacteria, fungi and viruses), chemical agents, biochemical, toxins, pharmaceuticals, enzymes, metabolites, cellular moieties, antigens and the like. For example, the present system may be adapted to detect any type of analyte that can bind a suitable binding agent, or react with a suitable reagent(s), the product of which is capable of being detected and optionally bound by a suitable binding agent. The binding agent may be any suitable agent which is able to bind specifically to the analyte or reaction product to be detected. For example, if the analyte is a protein or peptide, the binding agent may be a receptor or antibody which is capable of specifically binding to the protein/peptide. Conversely an antibody may be bound by a protein/peptide which the antibody is designed to specifically bind to. Nucleic acids may be bound by other nucleic acids which are capable of specifically hybridising to the analyte nucleic acid. Microorganisms may be bound by antibodies which specifically bind to proteins on the surface of the microorganism. Chemical agents, toxins, pharmaceuticals, metabolites may be bound by chemical moieties which are capable of reacting or binding to the aforementioned chemical analytes via appropriate bonding reactions, or affinities. Many types of binding techniques are well known to those of skill in the art.

Moreover, the/said reagent may be an enzyme or an enzyme substrate. For example analytes such as glucose through well described enzymatic methodologies may be detected, as a reaction product formed following the enzyme reacting with the glucose, which may be detected by using electrochemical, or optical detection techniques known to the skilled addressee. Such measurements can be made as standalone measurements or in combination with other analytes to be detected in the sample.

It should be appreciated that reference herein to analyte/analyte binding agent complexes includes complexes in which the analyte is unmodified from its form found in the liquid sample, or where the analyte has been modified through reaction with a further reagent and hence may be considered as an analyte reaction product.

The binding agent may itself be attached directly or indirectly to a wall or surface of said microfluidic channel(s) within the cartridge, by suitable bonding to the wall or surface, for example, by way of physical adsorption, covalent chemical coupling, non-covalent chemical bonding (e.g. biotin-avidin) or a combination of any of the above. In a preferred embodiment the binding agent is in the form of a magnetic or paramagnetic particle, comprising a binding moiety and the binding moiety may be bound directly or indirectly, for example by non-covalent chemical bonding (e.g. biotin-avidin) to the surface of the particle. Additional embodiments could also include physical adsorption, covalent chemical coupling, non-covalent chemical bonding (e.g. biotin-avidin) or any combination of these to the surface of a magnetic agent, such as a magnetic particle. The magnetic agents/particles which are functionalised to comprise the binding agent bound thereto, may simply be deposited within said microfluidic channel(s) of the cartridge, such that upon the sample being applied to the cartridge and being drawn into and along said/each channel(s), the functionalised magnetic agents/particles are resuspended by the liquid sample and hence come into contact with any analyte in the sample. The area or areas of deposition for the binding and/or other reagents may be specifically defined using hydrophobic stop or other features at either or both ends of the area of deposition, through the techniques described previously in order to optionally separate this area or areas from the detection area/zone. Where appropriate this may ensure that high background readings are not obtained due to reagent components (e.g. fluorescent latex particles) being dried down in the measurement/detection area/zone.

As mentioned above as well as the binding agents, the cartridge may and/or alternatively comprise one or more reagents deposited within said microfluidic channels(s), which reagents may facilitate detection of the analyte or captured analyte. For example said one or more reagents may include a label which has been adapted to specifically bind to the analyte, thus facilitating its detection, or an enzyme which reacts with an analyte in order to generate an analyte reaction product. Thus, in accordance with the present invention, the assays described herein can be used to detect an analyte or an analyte reaction product thereof.

Bound analyte may be detected directly providing the bound analyte is capable of generating a detectable signal, or upon binding of the analyte a reaction may place, so as to generate a reaction product and the reaction product may be detected. However, in a preferred embodiment, bound analyte is contacted with a label which is able to bind the bound analyte and a label/binding agent/analyte complex is subsequently detected. The label may itself be bound to a further binding moiety which is also capable of specifically binding to the binding agent/analyte complex. Typically the label is able to bind to a different portion of the analyte to which the first binding agent binds, or is capable of binding to a region of the binding agent/analyte complex which is formed only on generation of such a complex.

Bound analyte may be transported to the label within a different region of the microfluidic channel by way of gas being drawn back into the fluid filled chamber, which as a consequence draws the fluid sample further along the microfluidic channel in the direction of said/each gas filled chamber.

Desirably the binding agent and any detection agent/label are in a dry state when deposited in the microfluidic channel(s) of the cartridge, so that they are capable of long-term storage and are reconstituted by the liquid sample upon the liquid sample flowing into and along the microfluidic channel(s).

In one embodiment, the binding and/or detection agent/label which is designed to facilitate detection of the analyte, is initially located downstream (in terms of the direction the sample flows into the cartridge following introduction) from a first stop feature. In this manner said binding agent and/or detection agent does not initially come into contact with the sample upon initial sample application and capillary fill within the cartridge. Only when a force applied to said/each gas filled chamber is reduced and gas is drawn back into the gas filled chamber, is the sample drawn further along said/each microfluidic channel and brought into contact with the binding agent and/or detection agent.

In one embodiment, transport of the sample along the microfluidic channel may occur in a plurality of stages. For example, following initial sample application and capillary fill, the sample may be drawn along a first portion of said/each microfluidic channel, by a controlled reduction in force being applied to said/each gas chamber and gas being drawn back into said/each gas filled chamber in a controlled and accurate manner. The first portion of said/each microfluidic channel may comprise said binding agent for example. Thus introduction of the fluid sample into the first portion allows the binding agent to react with any analyte which may be present in the liquid sample. Thereafter the sample and binding agent can be drawn to a second portion of said/each microfluidic channel, by a further controlled reduction in force being applied to said/each gas chamber, so that more gas is drawn into said/each gas filled chamber, which in turn draws the sample and binding agent into the second portion of said/each channel. A further reagent or label for example may be present in the second portion and the sample and binding agent is brought into contact with this. In this manner a number of separate steps or stages in relation to a particular assay can be easily realised and each step/stage may require a time period which is different to another. It should be appreciated that more than two stages, such as three, four or more stages can easily be envisaged, with each stage being effected by a further controlled reduction in force as applied to the/each gas filled chamber. Advantageously, each gas chamber can be independently controlled. In this manner it is also possible for a plurality of different types of assay to be conducted using a single cartridge of the invention. In this manner each separate channel is provided with the necessary reagent(s) for conducting a particular assay or assays and the reader is programmed to effect the necessary number of gas chamber compression/decompression steps for each particular assay. Accordingly, the cartridges and associated reader of the present invention are capable of conducting, substantially simultaneously, a number of discrete and different assays which may require different reagents, reaction time periods, numbers of steps etc.

Although the above description discusses the drawing or pushing of the liquid sample in a step-wise manner, it will be appreciated that due the controllable nature of the force control means, it is possible to reversibly compress and decompress a gas filled chamber to minute or variable degrees, such as to permit the pushing and pulling of the liquid sample at any time point and allow a mixing effect. Thus, for example, when the liquid sample is transported to a region of the microfluidic channel which includes one or more reagents which is/are to be reconstituted by the liquid sample, upon reaching the area in which said one or more reagents are deposited, the liquid sample may be pushed and pulled back and forth using small compressions/decompressions of each/said gas filled chambers, for a period of time, to facilitate reconstitution and/or mixing of said one or more reagents within the liquid sample.

Necessary control and implementation of the methods and assays of the present invention can be facilitated by use of a suitable micro processing device and associated software within the reader.

In another embodiment, after the initial binding phase between the sample and the binding agent, such as a magnetic particle, the binding agent-analyte complexes formed within the sample liquid can be transported to a downstream region of the channel, where the label is located in dry form within the microfluidic channel. The sample liquid resuspends/rehydrates the label and allows binding of the label to the binding agent-analyte complexes. This transport of the liquid sample and any reconstituted material is due to decompression on each/said gas filled chamber drawing gas back into each/said gas filled chamber. Drawing of gas/air back into each/said gas filled chamber causes a vacuum effect which serves to draw the liquid sample along said/each microfluidic channel. This method may allow greater control of rehydration of deposited reagents and homogeneity of reagent dispersion.

In another embodiment, the binding agent and the label are deposited in the same region of said/each microfluidic channel. The sample rehydrates these reagents substantially at the same time allowing the binding and labelling reactions to occur at the same time. In this embodiment all the reagents can contact the sample, the reader then accumulates the magnetic particle-analyte-label complexes within the detection area via the application of a magnet/electromagnet. Unlike other prior art devices, the magnet/magnetic force may be designed so as to simply accumulate or concentrate the magnetic particles within the detection zone. Thus, the magnet/magnetic force may not serve to draw or move the magnetic particles longitudinally along said/each microfluidic channel, but rather to concentrate and hold any complexes in an area of the detection zone. In one embodiment the magnetic particles may be initially deposited within the microfluidic channel at a location which is opposite to where the magnetic force is to be applied. For example, the magnetic particles may be deposited at or along the bottom of a channel and the magnet or magnetic force is to be contacted/applied to the top surface of the cartridge. In this manner, the magnetic particles will be drawn laterally (or perpendicular to the flow of liquid sample within the channel) through the channel on application of the magnetic force. It is expected that the process of actively drawing the magnetic particles through the liquid sample increases the number of possible capture events which may occur between the functionalized magnetic particles and analyte which may be present in the liquid sample.

In one embodiment an electromagnet is provided which is positioned to be in line with the detection zone of the cartridge once correctly inserted within the reader. The particle-analyte-label complexes may be drawn to the detection zone by controlled fluid movement and only once in the detection zone, is the electromagnetic force applied. Additionally the electromagnet may be adapted so as to provide a focussed magnetic field within the detection zone. This can serve to concentrate the particle-analyte-label complexes within a defined portion of the detection zone, rather than across the whole of the detection zone. Alternatively to the magnet being present in the reader, it is possible to provide a magnet or the appropriate electromagnetic field generating circuitry within the cartridge itself. For example, electromagnetic field generating circuitry may be positioned adjacent to the detection zone and include electrical connectors or the like which is/are intended to contact corresponding connectors within the reader. Once connected together the reader is capable of providing the necessary electrical signals for generating the electromagnetic force.

In order to facilitate detection of bound analyte it may be desirable to remove spent liquid sample from said/each detection area in which the bound analyte is to be detected. When required, the present invention achieves this by use of the gas which is present in said/each gas filled chamber removing/pushing the reacted or spent liquid sample from said/each detection zone of the microfluidic channel, and when present, towards and into the waste chamber. The bound analyte, such as a magnetic particle-analyte-label complex may then be detected and/or quantified in a substantially liquid free or substantially gaseous environment. It is to be understood that the bound analyte may still be "wet", that is, there may be some residual liquid coating, surrounding, or otherwise associated with the bound analyte, but the bound analyte as understood by the skilled reader is not present in a bulk liquid. For example, the bound analyte may remain hydrated (e.g. it is not considered as being in a "dry" state) during detection even though it is not present in a bulk liquid.

Advantageously the present invention, through careful control of the movement of gas into and out of said/each gas chamber is able to accurately control the rate of liquid movement along each channel, in either direction. For example, it may be desirable that the reconstitution of dried reagents which are deposited within said/each channel occurs quickly, but the removal of liquid sample and unbound material following any necessary reaction(s) taking place, occurs relatively slowly. Thus, the reader and associated force control means are able to vary or alter the speed of gas expulsion out of/ingress into said/each gas chamber, which has a corresponding effect on the speed/rate of liquid movement in said/each channel. Different assays may require different reconstitution and/or liquid removal speeds and this can also be independently controlled by the force control means in combination associated programming or software.

Moreover, through fine control of the force control means, it is possible to carefully control very small volumes of gas expulsion out of/ingress into said/each gas chamber, with a corresponding small movement of the liquid sample. For example, it is possible for the volume of gas which is expelled or introduced into said/each gas filled chamber to be in increments of less than or equal to 500 nl, such as less than or equal to 200 nl, 100 nl, or even 50 nl, 25 nl, or 15 nl, 10 nl or even less. Such small volumes of gas movement result in very small corresponding linear movements of the liquid in said/each channel. In embodiments of the invention where detection is carried out in a substantially liquid free environment, the inventors have observed that it is possible to use such very small volumes of gas to remove the liquid sample and/or non-captured material from just the detection zone, or even portion thereof and hence provide the captured analyte or analyte reaction product in a substantially liquid free environment in which bulk liquid and non-captured material has been removed by the gas. This is very different to what would be considered as a conventional washing step in the art, which would use large volumes of a fluid, typically a liquid, to wash the sample detection zone/bound analyte etc before carrying out the detection step. In fact, the use of air in present invention may not be considered as a wash, but rather simply removing the liquid sample and non-captured material within it. Thus, where the liquid sample and/or non-captured material needs to be removed from the detection zone, the present invention is capable of using a volume of gas which is substantially equivalent (or very slightly larger, e.g. 15 nl, 25 nl, 50 nl, 100 nl or 200 nl) in volume to the volume of the detection zone or portion thereof where detection occurs, as this is sufficient to remove the liquid sample from the detection zone or portion, leaving the analyte or analyte reaction product in a substantially liquid free environment. In a conventional washing step, many volumes of wash as compared to the sample volume would generally be required.

Moreover, relatively speaking, only a small proportion, such as less than 50%, 40% or 25% of the volume of said/each gas chamber(s) may be required for control of liquid sample transport into said/each channel and/or liquid sample removal from each/said detection zone, when required.

Each cartridge may be designed to carry out single analyte detection or multiple analyte detections. Moreover, each cartridge may comprise more than one microfluidic channel system, so that more than one assay may be carried out using a single cartridge. It is also possible to carry out more than one assay per microfluidic channel. In this manner each cartridge may be capable of carrying out many repetitions and/or distinctly different assays from a single liquid sample, as said/each gas chamber is independently controllable.

Desirably the cartridges may be mass produced easily. The cartridge may be provided in a strip, where a number of cartridges are initially connected together for example, such as by way of a perforated seal. In this manner, the user can easily remove a cartridge from the strip, prior to use.

Once the cartridge has been loaded with a sample, any captured analyte may be detected by way of a suitable optical or other means present in reader device. The present invention provides such a reader and an important aspect of the present invention is the provision of at least one force control means which is/are present in the reader and which is/are designed to control force applied to an external surface of said one or more gas filled chambers, so as to expel/introduce gas from/to said/each gas filled chamber. A reduction in the force applied by the force control means will result in gas being drawn back into said/each gas filled chamber. One advantage of the present invention is that the cartridges themselves may be initially "dry", that is contain little or no bulk liquid within the cartridge prior to sample application. This not only simplifies manufacturing of the cartridges themselves, but also improves shelf-life and allows many of the cartridges of the present invention to be stored at room temperature, with little degradation of the chemical or biological components within the cartridge, prior to use.

In a further aspect there is provided a reader device for use with a microfluidic system of the present invention, the reader device comprising:

force control means for controlling compression or decompression of a gas filled chamber of the microfluidic system; and detection means for enabling detection of a desired analyte within a liquid sample introduced into the microfluidic cartridge, or analyte reaction product thereof;

wherein the force control means comprise a piezoelectric bending actuator which is designed to directly or indirectly effect compression or decompression the gas filled chamber through displacement of the actuator.

Pierre Curie discovered the piezoelectric effect in 1883. He noted that certain materials, such as quartz crystals, produce a voltage when they are mechanically stressed. Conversely, those materials' shapes are deformed when a voltage is applied to them. As a result, they can be used as transducers, converting electrical signal into mechanical vibration.

Various materials have piezoelectric properties; the most commonly used being Lead Zirconate Titanate (PZT). Modifying the ceramic's chemical composition and manufacturing process can alter performance of the piezo bender. When the PZT-layer is joined to a proper substrate sheet (e. g. a thin metal plate), any electrical activation of the PZT plate leads to a planar movement of the plate relatively to the substrate and induces thereby an internal mechanical stress resulting in a bending movement of the composite structure similar to a thermo-bimetal Piezo benders are well known in the art. Typically, a piezo ceramic crystal may be coated with silver on both sides and glued to a brass, nickel alloy, or stainless steel strip.

The ceramic can be configured with or without a feedback. Feedback may be used in conjunction with an external circuit to monitor the operation of the piezo bender and adjust the input signal to maintain a consistent output frequency.

Benders can be made in a great variety of geometries, cut from a PZT bilayer or multilayer-structure. The piezo benders of the present invention may take the form of strip-benders. For strip benders, one end of the strip is fix mounted, with the other end moving freely: For this mounting, the maximum displacement of a strip-bender is achieved and the specified data for displacement, stiffness and resonance refer to this situation. The displacement depends on the free moving length of the strip. Usually approx. 5-10% of bender's total length is provided for mounting purposes. Mounting can be done by clamping or by using adhesives like epoxies, cyano-acrylates etc.

The piezoelectric bender may be initially biased, or cause an associated foot or finger, into contact with an external surface of a gas filled chamber. In this manner a maximum force as applied to the gas chamber may be provided initially, which causes gas to be expelled from the gas chamber. Upon suitable electric signalling the piezoelectric bender can be induced to bend away from the external surface of the gas chamber resulting in a decrease in the force applied to the chamber and a resulting drawing of gas into the chamber. As each gas chamber is in fluid communication with said/each microfluidic channel(s), it is readily understood by the skilled reader how the gas which is expelled or drawn into a respective gas chamber, causes a corresponding directional movement to the liquid sample in the respective microfluidic channel.

The reader may include a receiving port into which the cartridge is to be inserted. The reader may be adapted so as to ensure correct insertion of the cartridge and this could take a variety of forms. For example, the cartridge may be initially located on a carrier mechanism which enters the reader, such as may be found in computers for loading CDs and the like. Alternatively the receiving port may be sized to allow the cartridge to be received and an internal stop member may be found within the reader which the cartridge abuts once inserted correctly. Additionally, or alternatively, features found on or cut into the surface of the cartridge may be designed to co-locate with features found within the reader and only once the cartridge is correctly located in the reader, will the cartridge be able to be controlled by the reader. Different sized receiving ports may be provided, or a single receiving port appropriately shaped to accept different sized cartridges which are designed to carry out a specific number of assays, for example.

The reader may be configured, possibly through appropriate software, to carry out a variety of different types of assay. The user may be provided with a kit comprising assay cartridges and optionally sample collection devices. The cartridges may comprise a barcode or other surface features which the reader device is able to determine, which may serve to inform the reader the type of cartridge which has been inserted into the reader and hence what assay or assays are to be conducted and hence how the reader is supposed to function and/or to provide patient details for example. In this way, a single type of reader may be provided which is capable of receiving a variety of different cartridges which can conduct different assays and/or panels of assays.

In the embodiment where the binding agent is bound to the surface of magnetic agents, such as magnetic beads, it is understood that the reader will comprise a permanent magnet or electromagnet. The magnet will be designed to be brought into close proximity with the magnetic agents, or the electromagnet induced to apply a magnetic field, in order to concentrate and hold the magnetic particles in a particular area of said microfluidic channel of the cartridge. This area may be the detection area. In one embodiment an electromagnet is employed, which is switched on only once the magnetic particles have been transported to the detection zone. Through appropriate design it is also possible to control or focus the magnetic field of the electromagnet to ensure that the magnetic particles are focused and held within a small region of the detection zone. This can serve to accumulate the magnetic particles to a small area and increase the signal which can be detected.

Concentrating the magnetic particles into a particular area may serve to facilitate detection of any captured analyte and/or increase sensitivity of detection. Moreover, by holding the particles by way of the magnetic field it also allows unwanted/spent fluid sample surrounding the bound analyte to be removed by gas expelled from said/each gas filled chamber(s), thereby leaving the captured analyte free of potentially interfering agents/contaminants which may be present in the initial sample. The permanent magnet or electromagnetic field may be reduced or increased, such as by moving a permanent magnet closer to, or further away from the cartridge, or by increasing or decreasing the intensity of the applied field. This may serve to allow the magnetic particles to "relax" or become less concentrated in a particular location, whilst still being held to a certain extent by the magnetic field or not. This may facilitate further reactions to be carried out on the particles, which may be conducted more efficiently compared to if the magnetic particles where tightly concentrated. It may also be preferred in certain applications that the detection is carried out when the particles are less "concentrated" or relaxed.

In use the magnet may be used to hold any bound agent once the magnetic field has been applied to the sample. Gas may be expelled from said/each gas filled chamber in order to transport the liquid sample and any non-bound components present in the sample away from said/each detection area and/or allow other reagents such as a detection agent to be brought into contact with the captured analyte. Careful control of the speed of gas movement and a corresponding liquid sample and any non-bound component removal is necessary in order to ensure that the force of the gas is not sufficient to strip the magnetically bound material. Thus, the speed of gas being expelled from said/each gas filled chamber can be carefully controlled. In certain embodiments it may be desirable to draw the liquid sample and reagents etc past the detection zone, before applying a magnetic field/force. Thus, any capture of the magnetic particles only occurs once the liquid sample is pushed back through the detection zone by gas being expelled from the gas chamber.

In another embodiment, magnetic particles could be coated in a binding reagent designed to remove interferences from the sample. The magnetic particles would bind this interferent present within the sample and the magnetic particles may then be held in a specific location separate from the specific capture/detection reagents and/or detection zone to allow the reaction to proceed and be measured in the absence of the specific interferent(s).

The reader of the present invention further comprises detection means for detecting any captured analyte within the sample cartridge. The detection means may be any suitable means depending on the particular assay. For example, the detection means may be a fluorimeter or spectrophotometer, which may be used to detect a fluorescent signal, once appropriately excited, from the labelled or unlabelled bound analyte or reaction product. The bound analyte/reaction product may naturally fluoresce once light of an appropriate wavelength has been used to excite the analyte/product, or a further label may be used to separately bind to the bound analyte and the label detected by fluorescent means. Other labels which may be employed and hence the detection means adapted accordingly, include radiolabels, phosphorescent labels, colloidal metal particles, bioluminescent labels, colourimetric labels, electrochemical labels and the like. Moreover, as mentioned above the analyte or reaction product thereof, or bound analyte or reaction product itself may be directly detected using techniques such as Raman spectroscopy and the like. In some embodiments the detection means are designed to optically detect the analyte or analyte reaction product, or a captured analyte/analyte reaction product and/or label attached to any of the aforementioned moieties.

Detectable labels may be used alone, or in conjunction with a microparticle or bead, such as a metal oxide, polysaccharide or latex particle. Many types of latex and other particles are known in the art The reader comprises force control means comprising one or more piezo benders discussed above for contacting said/each gas filled chamber of the cartridge and reducing or increasing a force applied to said/each gas filled chamber(s), by increasing or decreasing the bend formed by the bender. Where more than one gas filled chamber is provided a separate independently controlled piezo bender may be provided for each gas filled chamber. The force control means may include a finger or foot which is designed to contact and apply force to an outside surface of said/each chamber. In this manner the piezo bender acts upon the finger or foot, such that the finger/foot acts upon the gas filled chamber. In use, prior to the force control means contacting an outside surface of said/each chamber, the chamber will be in a maximum volume, gas-filled state. Upon contacting the surface of said/each gas filled chamber and a force being applied, gas within said/each chamber will be expelled. Increasing the force applied will result in further gas being expelled from said/each chamber. Conversely, a reduction of the force applied to said/each gas filled chamber by the force control means, will result in gas being drawn back into said/each chamber.

The finger/foot may be designed to contact a central portion of an outside surface of said/each chamber. Typically the finger/foot may contact only a portion of the total external surface of said/each gas filled chamber. For example, in use, the finger/foot may contact the top surface of a cartridge and be sized to contact between 10 and 50% of the top surface area overlying the gas chamber. The finger/foot which is in contact with the surface of the cartridge is raised and lowered, or forced into contact and relaxed from the surface of the gas chamber using the piezo bender as described. Speed and degree of bending and hence action of the force control means can be carefully controlled in order to be able to control the speed and amount of gas which is expelled from or drawn into said/each gas filled chamber.

The reader may include other features, such as a heating device to allow assays to be conducted at a particular temperature, as well as appropriate electrical circuitry and software to allow the reader to be programmed to carry out one or more different assays.

In a further aspect there is provided an assay system comprising a self-contained microfluidic system and an associated reader device, wherein:

the self-contained microfluidic system comprises:

a sample input port for receiving a liquid sample to be assayed, the sample input port connected to at least one microfluidic channel, wherein each/said microfluidic channel(s) comprises one or more reagents deposited therein for use in conducting an assay and a detection zone for use in detecting any analyte which may be present in a sample or analyte reaction product; and each/said microfluidic channel(s) is in fluid communication with a compressible, gas-filled chamber downstream from each/said detection zone, wherein the microfluidic system is formed from three layers, which are sandwiched together in order to define each/said microfluidic channel(s) and said gas filled chamber, and wherein compressing or decompressing said chamber causes gas to be expelled from or drawn into the chamber, which in turn causes movement of the liquid sample within said/each microfluidic channel; and a reader device for use with the microfluidic system, the reader device comprising:

force control means for controlling compression or decompression of the gas filled chamber of the microfluidic system; and detection means for enabling detection of a desired analyte within a liquid sample introduced into the microfluidic cartridge, or analyte reaction product thereof;

wherein the force control means comprises a piezoelectric bending actuator which is designed to directly or indirectly compress or decompress the gas filled chamber through displacement of the actuator.

In a further aspect there is provided a method of conducting an assay on a liquid sample, the method comprising:
a) providing a microfluidic system as described herein to a reader device as described herein;
b) compressing a/said gas filled chamber(s) of the microfluidic system, so as to expel gas from said/each gas filled chamber(s);
c) introducing a liquid sample to the microfluidic system and allowing the sample to be drawn into said/each microfluidic channel(s) by capillary action, and/or partially decompressing said/each gas filled chamber(s) such that gas is drawn into said/each chamber(s) thereby causing the liquid sample to be drawn into said/each microfluidic channel(s);
d) allowing one or more reagent(s) to react with any analyte present in the liquid sample;
e) optionally partially further partially decompressing said/each gas filled chamber(s) of the microfluidic system, such that the liquid sample is drawn further along said/each microfluidic channel(s) towards said/each gas filled chamber(s) and optionally contacting the liquid sample with an analyte binding agent and/or one or more further reagent(s);
f) optionally capturing any analyte or analyte reaction product and compressing said/each gas filled chamber(s), such that gas expelled from said/each chamber(s) causes the liquid sample and uncaptured material to be pushed away from any captured analyte or analyte reaction product; and
g) detecting any analyte or analyte reaction product, or captured analyte or analyte reaction product.

It is to be appreciated that the step e) of the above method may be carried out as a single or multiple steps. Thus, depending on the assay to be carried out, step e) may be a single step such that the decrease in force applied to said/each gas filled chamber is a single decrease in force and the sample is drawn to a single location in said/each microfluidic channel. Alternatively, there may be multiple steps, such as 2, 3, or 4 steps, where successive decreases in force are applied to said/each chamber, resulting in the sample being drawn to any number of successive locations within said/each microfluidic channel depending on the number of times a decrease in force is carried out. Thus, the present invention allows for assays to be conducted where a single step or multiple steps are required.

Force as applied to the gas filled chamber may be provided by force control means as discussed hereinabove which comprise a piezo bender and optionally a finger or foot in association therewith.

The rate at which an increase or decrease in force application to said/each gas filled chambers can be varied in order to increase or decrease the speed of liquid movement in said/each channel. For example the decrease in force applied in step e) may be more rapid than the rate of increase in force as applied in step f) when required.

The capturing of analyte/analyte binding agent complexes may be due, for example, to the analyte binding agent being bound to a surface of the microfluidic channel, or captured by virtue of being magnetic and applying a magnetic force to the formed complexes. The magnetic particles which are employed to form the complexes may initially be deposited on a surface of said microfluidic channel(s) which is opposite to the surface of the cartridge to which the magnet is brought into close contact, or the magnetic force applied. The effect of this is that the magnetic particles are drawn laterally through said microfluidic channel(s) perpendicular to the flow of liquid through said channel(s), which increases and/or enhances contact of the magnetic particles with the analyte or analyte reaction product, thereby increasing sensitivity of the assay.

It is possible for more than one embodiment of the above methods to be carried out using a single cartridge. Thus, for example, a method which includes step f) above may be carried out on one channel within a cartridge of the present invention and a method which does not include step f) may be carried out on a separate channel. Additionally, or alternatively step e) may be carried out singly or multiple times on the aforementioned channels and/or additional channels. In this manner multiple different types of assays may be conducted using a single cartridge which comprises a plurality of assay channels.

The present invention is further based on the development of an assay system which comprises a disposable microfluidic cartridge which is capable of conducting a number of different assays on a single sample and an associated reader which is capable of detecting and/or determining levels of a plurality of analytes from the single sample and providing an output to a user. The present invention also allows a variety of disposable cartridges to be received by the reader, each of said variety of disposable cartridges being capable of carrying out a distinct panel of different assays. In this manner a single reader can be provided which is capable of being used to provide results from a variety of distinct panels of different assays. In this regard, each cartridge may be specifically adapted for the number and types of assays which may be carried out. For example, different volumes of sample may be required for particular assays and this may be addressed independently through appropriate sizing of each channel and/or chamber. Thus, by increasing or decreasing the size of any particular channel, it is possible to increase or decrease the volume of sample which is introduced into each particular channel. Moreover, the size of any chamber which is connected to one or more channels may be increased or decreased as necessary, depending on the type of assay, number of steps and/or volume of sample being introduced into said channels. This is readily determined by the skilled addressee.

Thus, in a further aspect there is provided a self-contained disposable microfluidic system for use in conducting a plurality of distinct assays, the microfluidic cartridge comprising:

a sample input port for introducing a liquid sample into the microfluidic cartridge;

multiple microfluidic channels; each of said microfluidic channels being adapted to receive a portion of the liquid sample and being capable of conducting one or more assays on said portion of sample using one or more reagents which are present within each of said microfluidic channels prior to liquid sample introduction; and wherein fluid movement within each microfluidic channel is independently controllable by compression and/or decompression of two or more gas filled chambers of the microfluidic system, which chambers are each in fluid communication with one or more of said microfluidic channels.

It is to be appreciated that the above further aspect of the invention may be in addition to or as an alternative to the aspects and embodiments previously described above. Thus, all the features described in relation to the earlier aspects of the invention, may equally apply to the immediately above aspect and hence may be included as limiting or optional features.

It is also possible to carry out assays using the cartridges of the present invention which in addition to having channels which are in fluid communication with a chamber or chambers, further comprise one or more channels which are not in fluid communication with any gas chamber or chambers. A non-limiting example of such an assay is described in the examples section herein below.

The microfluidic cartridge of the present invention is self-contained in the sense that other than the sample itself, all other physical reagents necessary for conducting each assay, are present in the microfluidic cartridge prior to each assay process being carried out. Thus, other reagents, such as reactive species, buffers, wash liquids etc, are not introduced into the cartridge during the assay process. Typically the only liquid which enters the cartridge is the liquid sample itself. Any reagents which may have been deposited in said/each channel may have been initially applied by way of a liquid, but this will have been dried and the cartridge, prior to conducting any particular assay, can be considered as being dry with no or substantially no liquid present.

Heating/cooling and/or magnetic force application may be provided to the cartridge from an associated reader, as discussed below, but this is not to be construed as a physical reagent.

Multiplex assay in the context of the present invention is to be understood as meaning that each microfluidic cartridge is capable of not only carrying out a plurality of assays from a single sample, introduced into the cartridge, but that the cartridge is capable of carrying out a plurality of distinctly different types of assays. For example, each microfluidic cartridge of the present invention is capable of carrying out at least two, three, four, five or more of the following types of assays: immunoassay, nucleic acid assay, receptor-based assay, competition assay, cytometric assay, colorimetric assay, enzymatic assay, electrophoretic assay, electrochemical assay, spectroscopic assay, chromatographic assay, microscopic assay, topographic assay, calorimetric assay, turbidmetric assay, agglutination assay, viscometric assay, coagulation assay, clotting time assay, protein synthesis assay, histological assay, culture assay, osmolarity, chemistry, biochemistry, ion, gas, or absorption assay. In certain embodiments a particular type of assay may be carried out in order to detect different analytes. For example, more than one immunoassay may be carried out in order to detect different analytes. Said more than one immunoassay may be carried out in a single and/or multiple microfluidic channels.

In an embodiment, a microfluidic cartridge of the present invention is designed to conduct a panel of assays relating to a particular disease or condition. Exemplary test panels may include panels of assays for heart conditions, adrenal gland condition, liver function, kidney function, neurological function, diabetes, pregnancy and pregnancy conditions, a metabolic condition and drugs of abuse.

For example, a microfluidic cartridge which is designed for assaying for markers associated with heart conditions may comprise an assay or assays designed to detect and/or determine a level of one or more of the following:

Lipid profile—which may detect low density lipoprotein (LDL), high-density lipoprotein (HDL), triglycerides and/or total cholesterol, for example;

Apolipoproteins—the protein component of lipoproteins—are not included in a standard lipid profile, but may be tested separately. Abnormal levels may promote atherosclerosis, and may increase the risk of coronary artery disease (CAD) and stroke;

Homocysteine—is an amino acid (protein building block). Elevated blood levels may promote atherosclerosis and CAD, as well as blood clots that can lead to a heart attack or stroke;

Troponin; BNP;

C-reactive protein (CRP) is a substance that reflects low levels of systemic inflammation and is increased in people at risk for CAD; and Cardiac markers, such as cardiac enzyme studies measure certain enzymes, such as CK-MB, or troponins, or cardiac hormones such as brain natriuretic peptide, that are released in when the heart is stressed or diseased or damaged, as from a heart attack.

Subjects experiencing stress or other conditions may be subjected to an adrenal function panel, which may include one or more of the following:

Aldosterone controls salt, potassium, and water balance in the body and helps to regulate blood pressure. Overproduction (hyperaldosteronism) or underproduction (hypoaldosteronism) of this hormone may be caused by tumors or other abnormalities within the adrenal glands (primary; e.g., adrenal cancer) or may result from problems outside the adrenals (secondary);

Cortisol is a glucocorticoid hormone that helps to control the metabolism of carbohydrates, proteins, and fats; mediate the body's response to stress; and regulates the immune system. Over secretion of cortisol, most often caused by a benign adrenal tumor, results in Cushing's syndrome. Under secretion may indicate a form of adrenal insufficiency known as Addison's disease. Both blood levels and urine levels (known as free cortisol) are usually measured;

18-Hydroxycortisol, a product of cortisol metabolism, is an unusual steroid produced in excessive amounts in patients with primary hyperaldosteronism. Measuring blood levels of this hormone can help to determine whether primary hyperaldosteronism is caused by a tumor called adrenal adenoma, or by overgrowth (hyperplasia) of adrenal tissue; levels are significantly higher in people with an adenoma; and DHEA-S, or dehydroepiandrosterone-sulfate—a sex hormone (androgen) synthesized by the adrenal gland—is a precursor to testosterone. In women, the adrenal glands are the major, and sometimes only, source of androgens. Elevated DHEA-S levels are associated with virilism (male body characteristics), hirsutism (excessive hair growth), amenorrhea (absence of menstruation), and infertility. Adrenal abnormalities such as tumors may lead to abnormally high DHEA-S levels.

Liver function tests are used to help determine the cause of symptoms such as jaundice that may be due to liver disease. They are also used to screen for potential liver damage, for example in alcoholics or people exposed to the hepatitis virus, and also to monitor changes in abnormal liver function. Thus a liver function microfluidic cartridge of the present invention may include one or more of the following:

Enzyme tests: The liver is the site of many biochemical reactions that are controlled by numerous enzymes, including alanine aminotransferase (ALT), aspartate aminotransferase (AST), alkaline phosphatase (ALP), and gamma glutamyl transferase (GGT). Elevated levels of liver enzymes in the bloodstream may indicate liver damage; however, they do not necessarily point to a specific liver disease. Although enzyme tests may be ordered individually, they provide more information when performed in combination, since levels of many liver enzymes may be elevated in diseases affecting other organs;

Bilirubin, the main pigment in bile, is a breakdown product of haemoglobin, an iron-containing substance in red blood cells. Normally, only a small amount of bilirubin circulates in the blood. Elevated blood levels may result from many forms of liver and biliary tract disease, including hepatitis and bile duct obstruction. The presence of excess bilirubin in the blood produces a yellowish discoloration of the skin and eyes called jaundice;

Albumin is a major protein that, like most proteins in the bloodstream, is synthesized by the liver. A decreased level of albumin in the serum (the liquid portion of blood that remains after whole blood clots) is an indication of chronic liver disease;

Prothrombin time (PT) is a blood clotting study that may be performed to evaluate the function of the liver. Because prothrombin is one of the clotting proteins that is synthesized by the liver, an abnormal PT may reflect liver dysfunction;

Viral hepatitis tests may be done in people with abnormal liver enzymes whose medical history and/or symptoms raise suspicion of the disease. (Symptoms include low-grade fever, malaise, loss of appetite, and fatigue, but are not always present.) The three most common types of this virus found in the U.S. are hepatitis A, B, and C (known as HAV, HBV, and HCV); they are all detected by testing for the presence of specific antigens or antibodies found only in the blood of infected individuals. Different antibody/antigen tests may be performed, depending on which hepatitis type is suspected. In addition, the presence of particular antibodies can signal whether the infection is in an acute or chronic stage.

Panels of tests are often employed to consider a subjects risk of developing diabetes or confirming that a subject has type I or II diabetes. As well as a lipid panel described above, a diabetes panel microfluidic cartridge may be designed to conduct one or more of the following assays:

Complete Blood Count (CBC) tests for blood disorders such as infection or anemia;

Fasting Glucose is used to detect both hyperglycemia and hypoglycemia, to help diagnose diabetes, and to monitor glucose levels in persons with diabetes;

Hemoglobin A1c can detect pre diabetes, diagnose it, or see if diabetes is under control;

and Diabetic Urinalysis will determine if albumin (protein) is found in your urine (if so, it's possible that a subject's kidneys aren't working properly).

It is also possible to test for drugs of abuse or drugs which are considered as being banned for use by sportsmen and women. A microfluidic cartridge of the present invention designed to detect and/or determine a level of a drug of abuse in a subject, may be designed to assay for one or more of the following:

Amphetamines; Barbiturates; Buprenorphine; Benzodiazepines; Cocaine; Ecstasy; Methamphetamines; Heroin (Opiates/Morphine); Methadone; Tricyclic Antidepressants; Cannabis and/or other psychoactive agents It will be appreciated that the above described panels of assays are merely exemplary and should not be construed as limiting. In accordance with the present invention particular panels of assays can be envisaged and a cartridge in accordance with the present invention provided in order to conduct the particular panel of assays.

Although each panel of assays is conducted within a microfluidic cartridge of the present invention, results of each assay need to be detected and/or determined. This is carried out by a reader as described herein The reader may include a cartridge determination means, which may be a barcode/QR code reader or the like present in the reader which is designed to read a barcode/QR code or other type of code on the microfluidic cartridge. The code conveys to the reader information concerning the type of microfluidic cartridge and assays to be conducted, in order that the reader is prepared to carry out and detect/determine the results from the particular microfluidic cartridge. In a more simple embodiment said receiving ports of the reader may be designed to accept only a particular microfluidic cartridge type, much like a lock and key. Thus, each receiving port may only accept a particular type of cartridge whereby introduction of a cartridge into a specific receiving port instructs the reader as to which type of cartridge has been inserted and the assays to be conducted. A user could also enter details into the reader so that the reader is instructed as to the assays to carry out, but this may be less desirable since it could lead to user error.

The reader of the present invention is constructed such that it is capable of receiving a plurality of different microfluidic cartridges. "Different" is understood to mean that the cartridges of the present invention may be adapted to conduct a particular panel of assays, rather than the cartridges appearing visually overtly different. That is, two cartridges when placed side by side may visually look quite similar, but one cartridge may be adapted to carry out a panel of assays suitable for detecting heart disease and another cartridge may be adapted to carry out a panel of assays suitable for diabetes detection, for example.

Thus in a further aspect there is provided a multiplex assay platform for use in conducting multiple panels of assays, the multiplex assay platform comprising a plurality of microfluidic cartridges, each cartridge being capable of conducting a defined panel of assays on a sample and a reader constructed to be capable of receiving and verifying each of said plurality of microfluidic cartridges, whereby the reader is configurable for detecting and/or determining levels of a panel of analytes which may be present in the sample.

In use a subject will be predetermined for testing with a particular panel of assays, or a patient will visit a healthcare provider, such as a doctor, nurse or other medical professional and the healthcare provider will identify the subject as requiring a suitable panel of tests to be conducted. The patient or healthcare provider will select a cartridge which is configured to carry out the desired panel of assays and insert this chosen cartridge into the reader. The reader will determine from features present on the cartridge, which panel of assays the cartridge is designed to conduct and the reader will configure itself appropriately in order to be able to run the assays and detect and/or determine the levels of the particular panel of analytes present in sample from the subject. A sample will be provided or obtained from the subject and the sample introduced into the input port of the cartridge. The panel of assays will be conducted on the sample, by the reader and cartridge working together and on completion of the assays, the reader will detect and/or determine the levels of analyte which are present in the sample. The reader will then provide the results of the panel of assays to the subject and/or healthcare provider.

As well as healthcare providers, the user may be a law enforcement officer, or sport drug testing official, for example, where the subject is an individual being tested for inappropriate drug use, for example.

The present invention will now be further defined by reference to the following numbered clauses:

1. A microfluidic cartridge for use in conducting an assay on a liquid sample, the microfluidic cartridge comprising a sample input port connected to at least one microfluidic channel, wherein each/said microfluidic channel(s) comprises one or more reagents deposited therein for use in conducting the assay and a detection zone, each/said microfluidic channel(s) further fluidly connected to a compressible gas filled chamber, wherein compressing or decompressing an external surface of the chamber causes gas to be expelled from or drawn into the chamber respectively, which in turn causes a reciprocal movement of the liquid sample within said/each microfluidic channel.
2. The microfluidic cartridge according to clause 1, wherein following reaction of the liquid sample with said one or more reagents deposited within said/each microfluidic channel, gas expelled from the chamber serves to remove liquid from the detection zone within said/each microfluidic channel, in order that any analyte or analyte reaction product within said/each detection zone can be detected in a substantially liquid free environment.
3. The microfluidic cartridge according to clauses 1 or 2, comprising a plurality of microfluidic channels, wherein each of said plurality of microfluidic channels is in fluid communication with the sample input port.
4. The microfluidic cartridge according to clause 3 wherein each of said plurality of microfluidic channels is connected to a respective gas filled chamber, and/or two or more microfluidic channels are connected to a gas filled chamber.
5. The microfluidic cartridge according to any preceding clause wherein the sample port is connected to a first end of said/each microfluidic channel(s) and a second end of said/each microfluidic channel(s) is connected to one or more of said gas filled chambers.
6. The microfluidic cartridge according to any preceding clause further comprising one or more sink features designed to receive fluid waste and/or excess liquid sample.
7. The microfluidic cartridge according to any preceding clause wherein the cartridge and the channels and other features disposed therein, are formed by a sandwich of three separate planar substrates comprising a top substrate, a bottom substrate and middle substrate disposed between the top and bottom substrates.
8. The microfluidic cartridge according to clause 7 wherein each layer has a uniform thickness and is formed from the same material, optionally each layer having the same uniform thickness.
9. The microfluidic cartridge according to either of clauses 7 or 8 wherein the cartridge is formed from a web or roll-to-roll process
10. The microfluidic cartridge according to any of clauses 7-9 wherein the planar substrates are sealed together by application of heat and/or the use of adhesive.
11. The microfluidic cartridge according to clause 10 wherein the planar substrates are sealed together using an adhesive which is resilient and facilitates with the compressibility of each/said chamber.
12. The microfluidic cartridge according to any preceding clause wherein said/each microfluidic channel(s) in the cartridge comprises one or more fluid stop features, which are designed to prevent the sample and/or other fluids from passing through said stop feature(s) by virtue of capillary action alone.
13. The microfluidic cartridge according to any preceding clause comprising a one-way valve which is designed only to allow gas to exit the cartridge upon a liquid sample being introduced into the cartridge by capillary action, whilst not permitting fluid from being introduced into the cartridge via the valve.
14. The microfluidic cartridge according to clause 13, wherein the valve is positioned adjacent to a stop feature which has been designed to prevent further transport of the sample within the microfluidic channel by capillary action alone.
15. The microfluidic cartridge according to clause 14 wherein the valve is located within a microfluidic channel of smaller dimension than said/each microfluidic channel and which is in fluid communication with one of said microfluidic channels.
16. The microfluidic cartridge according to any preceding clause comprising one or more electrode features in contact with said/each channel(s) for use in measuring or detecting liquid present in said/each channel(s).
17. The microfluidic cartridge according to any preceding clause further comprising an analyte binding agent deposited within said channel(s), wherein optionally the analyte binding agent is bound to a surface of said channel(s).
18. The microfluidic cartridge according to clause 17 wherein the binding agent is attached to a magnetic or paramagnetic particle.
19. The microfluidic cartridge according to clauses 17 or 18 wherein the binding agent or magnetic/paramagnetic particle are deposited within said/each microfluidic channel(s) of the cartridge, such that upon the sample being applied to the cartridge and being drawn into said/each channel(s), the binding agents or magnetic/paramagnetic particles are resuspended by the liquid sample.
20. The microfluidic cartridge according to any of clauses 17-19 wherein the binding agent or magnetic/paramagnetic particles are deposited within an area of said/each microfluidic channel(s) defined by features at either end of the area of deposition designed to limit movement of the magnetic/paramagnetic particles when initially deposited in said/each channel.
21. The microfluidic cartridge according to either of clauses 19 or 20 wherein the magnetic/paramagnetic particles are deposited on a surface of said/each channel which opposite the surface of the cartridge to which a magnet or magnetic force is brought into close proximity.
22. The microfluidic cartridge according to any preceding clause wherein the cartridge further comprises one or more additional reagents deposited within said/each microfluidic channels(s), which additional reagents facilitate detection of analyte present in the sample.
23. The microfluidic cartridge according to clause 22 wherein said one or more additional reagents includes a label which has been adapted to specifically bind to an analyte to be detected for facilitating analyte detection.
24. The microfluidic cartridge according to clauses 22 or 23 wherein analyte is bound to the analyte binding agent in a first area of said/each microfluidic channel(s), before being transported to a further area or areas of said/each microfluidic channel(s), in which said one or more further reagents and/or label is deposited, by way of gas being drawn back into said/each gas filled chamber.
25. The microfluidic cartridge according to any preceding clause wherein said cartridge is capable of carrying out a plurality (such as 2, 3, 4, 5, 6, 7, 8, 9, 10 or more) of the same and/or different assays on a single sample.
26. The microfluidic cartridge according to any preceding clause wherein the volume of the sample applied to the cartridge is less than 50 μl, such as less than 40 μl, 30 μl, or 20 μl.
27. A kit comprising a microfluidic cartridge according to any preceding clause, together with a sample collection device.
28. The kit according to clause 26 wherein the sample collection device is adapted to be inserted into to sample input port of the cartridge and thereafter provide a seal to the input port.
29. The kit according to clause 27 for use in conducting a nucleic acid detection assay.
30. A reader device for use with a microfluidic cartridge of any of clauses 1-26, or kit according to clauses 26-29, the reader device comprising:
  a receiving port for introducing the microfluidic cartridge into the reader device;
  force application means for contacting an external surface of said/each gas filled chamber of the cartridge and being capable of exerting a variable force to said/each gas filled chamber, whereby an initial application of force to the surface of said/each gas filled chamber will result in gas being expelled from said/each gas filled chamber and along said/each microfluidic channel away from said/each chamber; and a reduction in the force applied to said/each gas filled chamber will result in gas within said/each microfluidic channel being drawn back towards and into the gas filled chamber; and
  detection means for enabling detection of a desired analyte or analyte reaction product present within a liquid sample introduced into the microfluidic cartridge.
31. The reader device according to clause 30 comprising a receiving port adapted for receiving different sized cartridges, each differently sized cartridge designed to carry out a defined number of assays.
32. The reader device according to clause 31 wherein the receiving port is so adapted to ensure correct insertion and identification of each differently sized cartridge.
33. The reader device according to clauses 30-32 further comprising a permanent magnet to be brought into close proximity to (or electromagnet which is designed to apply a magnetic field to), a cartridge according to clauses 18-26 which has been introduced into the reader, in order to concentrate and hold the magnetic/paramagnetic particles in the detection zone of said/each microfluidic channel of the cartridge.
34. The reader device according to clauses 30-33 wherein the force application means are in the form of a finger or a foot which is designed to contact and apply force to an external surface of a chamber of the cartridge.
35. The reader device according to clause 34 wherein said finger/foot is designed to contact only a portion of the total external surface of gas filled chamber.
36. The reader device according to clause 35 wherein each finger/foot is sized to contact between 10 and 50% of the external surface of each chamber.
37. The reader device according to any of clauses 30-36 wherein the force application means is designed to be raised and lowered into contact with the surface of the cartridge using a motor present within the reader.
38. The reader device according to clause 37 wherein the motor is capable of raising and lowering the force application means at a variable rate such that gas within the cartridge can be drawn into and/or expelled from said/each gas filled chamber at different rates.
39. The reader device according to clauses 30-38 wherein the detection means is an optical detection device, such as a fluorimeter or spectrophotometer.
40. The reader device according to any of clauses 30-9 further comprising heating and/or cooling means to allow assays to be conducted at a particular temperature, or plurality of temperatures.
41. A method of conducting an assay on a liquid sample, the method comprising:
  a) introducing a microfluidic cartridge according to any of clauses 1-26 into a reader device according to any of clauses 30-40;
  b) applying a force to a/said gas filled chamber of the microfluidic cartridge, so as to expel a portion of gas from the/said chamber;
  c) introducing a liquid sample into the microfluidic cartridge and allowing the sample to be drawn into the microfluidic channel(s) by capillary action, or decreasing the force applied to the/said gas filled chamber(s), such that air is drawn into the/said chamber(s) causing a liquid sample to be drawn into the microfluidic channel(s);
  d) decreasing the force applied to the/said chamber(s) of the microfluidic cartridge, such that air is drawn into the/said chamber(s) causing the liquid sample to be drawn further into the/said microfluidic channel(s) in order to allow contact with an analyte binding agent and optionally one or more further reagent(s);
  e) allowing any analyte/analyte binding agent complexes or analyte reaction product/analyte binding agent complexes to be formed and captured in a detection zone of the/said microfluidic channel(s);
  f) optionally increasing the force applied to the/said gas filled chamber(s) of the microfluidic cartridge, such that gas is expelled from the/said chamber(s) causing liquid to be expelled from at least a portion of the/said microfluidic channel(s) where the analyte/analyte binding agent complexes are captured, such that the captured analyte/analyte binding agent complexes are present in a substantially liquid free environment; and
  g) detecting any captured analyte or analyte reaction product optionally in said substantially liquid free environment.

42. The method according to clause 41 wherein step d) is carried out as a single or multiple steps, whereby the sample is drawn to a further or a number of successive locations respectively within said/each microfluidic channel corresponding to the number of times a decrease in force is carried out.

43. A method of conducting an assay on a liquid sample, the method comprising:
   a) introducing a microfluidic cartridge which comprises a compressible gas filled chamber or chambers into a reader device which comprises means for compressing/decompressing said chamber(s);
   b) applying a force to a/said gas filled chamber(s) of the microfluidic cartridge, so as to expel a portion of gas from the/said chamber(s);
   c) introducing a liquid sample into the microfluidic cartridge and allowing the sample to be drawn into a microfluidic channel or channels of the microfluidic cartridge by capillary action, or decreasing the force applied to the/said gas filled chamber(s), such that air is drawn into the/said chamber(s) causing a liquid sample to be drawn into the microfluidic channel(s);
   d) decreasing the force applied to the/said chamber(s) of the microfluidic cartridge, such that air is drawn into the/said chamber(s) causing the liquid sample to be drawn further into the/said microfluidic channel(s) in order to allow contact with an analyte binding agent and optionally one or more further reagent(s) which are present in the/said channel(s);
   e) allowing any analyte/analyte binding agent complexes or analyte reaction product/analyte binding agent complexes to be formed and captured in a detection zone of the/said microfluidic channel(s);
   f) optionally increasing the force applied to the/said gas filled chamber(s) of the microfluidic cartridge, such that gas is expelled from the/said chamber(s) causing liquid to be expelled from at least a portion of the/said microfluidic channel(s) where the analyte/analyte binding agent complexes are captured, such that the captured analyte/analyte binding agent complexes are present in a substantially liquid free environment; and
   g) detecting any captured analyte or analyte reaction product in the substantially liquid free environment.

44. The method according to clauses 41 or 43 wherein the analyte/analyte binding agent complexes or analyte reaction product/analyte binding agent complexes to be formed comprise margnetic or paramagnetic particles 45. The method according to clause 44 wherein the magnetic particles which are employed to form the complexes are initially deposited on a surface of said microfluidic channel(s) which is opposite to the surface of the cartridge to which a magnet is brought into close contact, or a magnetic force applied, in order that the magnetic particles are drawn laterally through said microfluidic channel(s).

46. The method according to clauses 43-45 wherein the step d) is carried out as a single or multiple steps, whereby the sample is drawn to a further or a number of successive locations respectively within said/each microfluidic channel corresponding to the number of times a decrease in force is carried out.

47. The method according to any of clauses 41-46 wherein the volume of gas which is expelled from the/said chamber(s) causing liquid to be expelled from at least a portion of the/said microfluidic channel(s) where the analyte/analyte binding agent complexes are captured, is sufficient to cause the liquid to be removed from the detection zone, but not further along the microfluidic channel(s).

48. A self-contained disposable microfluidic cartridge for use in conducting multiplex assays, that is a plurality of distinct assays, the microfluidic cartridge comprising:
   a sample input port for introducing a sample into the microfluidic cartridge and multiple microfluidic channels, each of said microfluidic channels being adapted to receive a portion of the sample and being capable of conducting one or more assays on said portion of sample, such that the microfluidic cartridge is capable of detecting and/or determining multiple different analyte levels in the sample and conducting multiple different types of assay on the sample using reagents which are present in the cartridge prior to sample introduction.

49. The self-contained disposable microfluidic cartridge according to clause 44 for use in a method according to any of clauses 41-46.

50. The self-contained disposable microfluidic cartridge according to clause 48 further comprising the features as defined in clauses 1-26.

51. The self-contained disposable microfluidic cartridge according to any of clauses 48-50 which is capable of carrying out at least two, three, four, five or more of the following types of assays: immunoassay, nucleic acid assay, receptor-based assay, cytometric assay, colorimetric assay, enzymatic assay, electrophoretic assay, electrochemical assay, spectroscopic assay, chromatographic assay, microscopic assay, topographic assay, calorimetric assay, turbidmetric assay, agglutination assay, viscometric assay, coagulation assay, clotting time assay, protein synthesis assay, histological assay, culture assay, or osmolarity assay.

52. The self-contained disposable microfluidic cartridge according to any of clauses 48-51 which is capable of conducting a panel of separate assays which are designed to test for a heart condition, an adrenal gland condition, a liver condition, diabetes or drugs of abuse.

53. The self-contained disposable microfluidic cartridge according to clause 52 for use in detecting a heart condition and wherein the panel of separate assays is for detecting lipid levels, apolipoprotein; homocysteine; C-reactive protein (CRP); and/or Cardiac enzymes.

54. The self-contained disposable microfluidic cartridge according to clause 52 for use in detecting an adrenal condition, and wherein the panel of separate assays is for detecting aldosterone, cortisol, 18-hydroxycortisol, and/or DHEA-S.

55. The self-contained disposable microfluidic cartridge according to clause 52 for use in detecting a liver condition and wherein the panel of separate assays is for detecting a level of one or more liver enzymes, bilirubin, albumin, prothrombin and/or the presence of a virus or viruses.

56. The self-contained disposable microfluidic cartridge according to clause 52 for use in detecting subjects at risk of developing diabetes or confirming subjects with diabetes and wherein the panel of separate assays is for detecting lipid levels, complete blood count, fasting glucose levels, haemoglobin A1c and/or albumin.

57. The self-contained disposable microfluidic cartridge according to clause 52 for use in detecting drugs of abuse, wherein the panel of assays is for detecting Amphetamines; Barbiturates; Buprenorphine; Benzodiazepines; Cocaine; Ecstasy; Methamphetamines;

Heroin (Opiates/Morphine); Methadone; Tricyclic Antidepressants; and/or Cannabis.

58. A multiplex assay platform for use in conducting multiple panels of assays, the multiplex assay platform comprising a plurality of microfluidic cartridges according to any of clauses 48-57, each cartridge being capable of conducting a defined panel of assays on a sample and a reader constructed to be capable of receiving and verifying each of said plurality of microfluidic cartridges, whereby the reader is configurable for detecting and/or determining levels of a panel of analytes which may be present in the sample.

59. A multiplex assay platform for use in conducting multiple panels of assays according to clause 58 for use with a reader device according to any of clauses 30-40.

The present invention will now be further described by way of example and with reference to the following figures which show:

Figure 7:
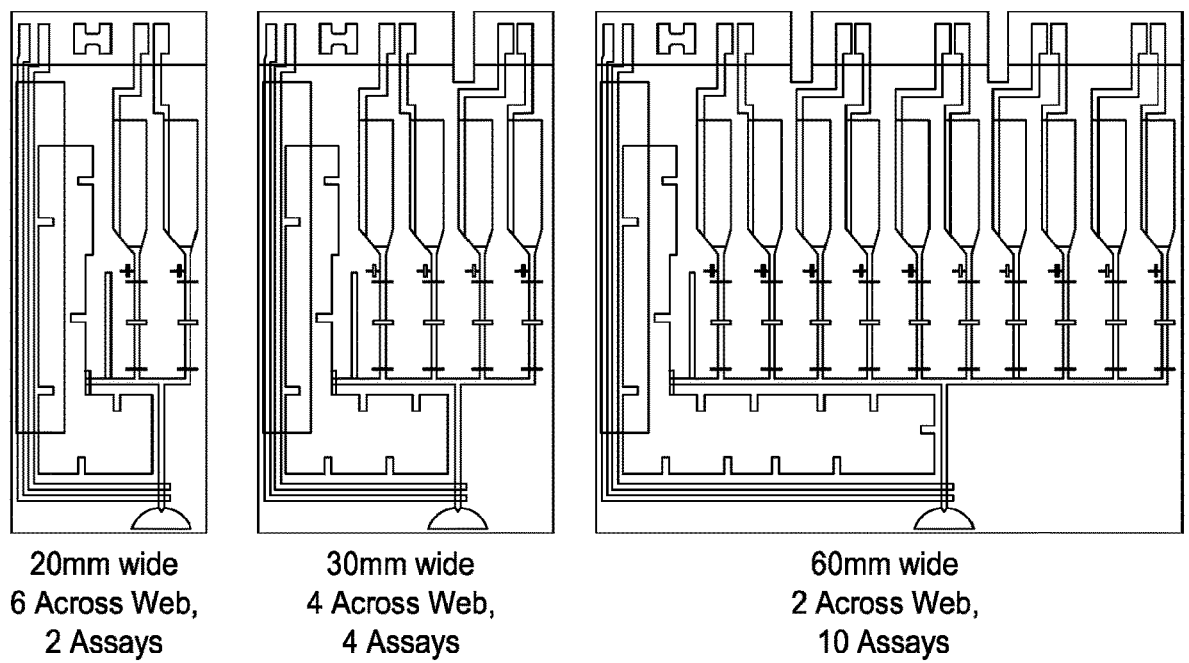
Figure 8:
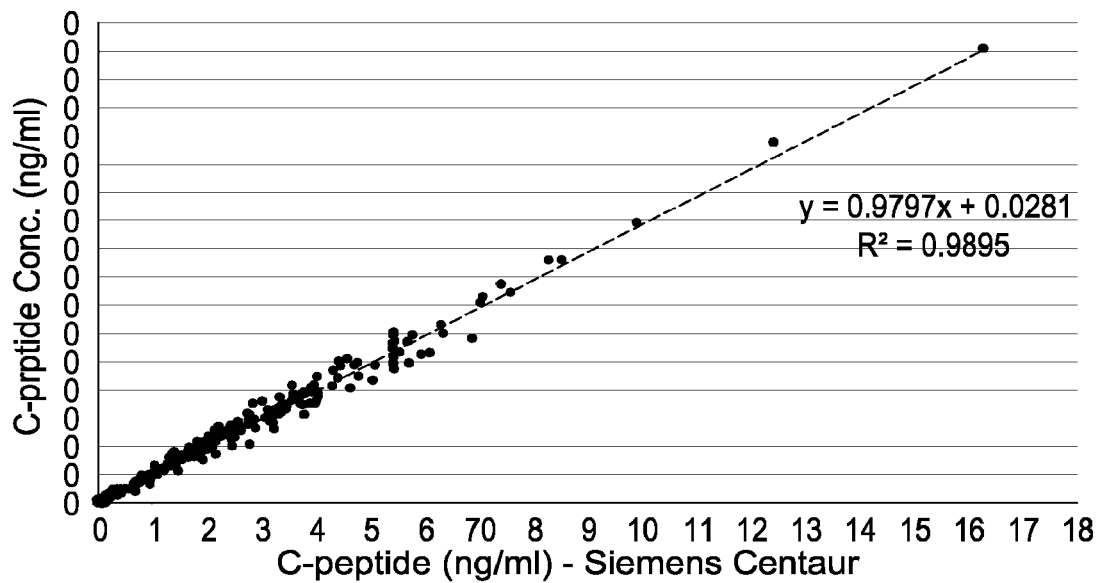
Figure 9:
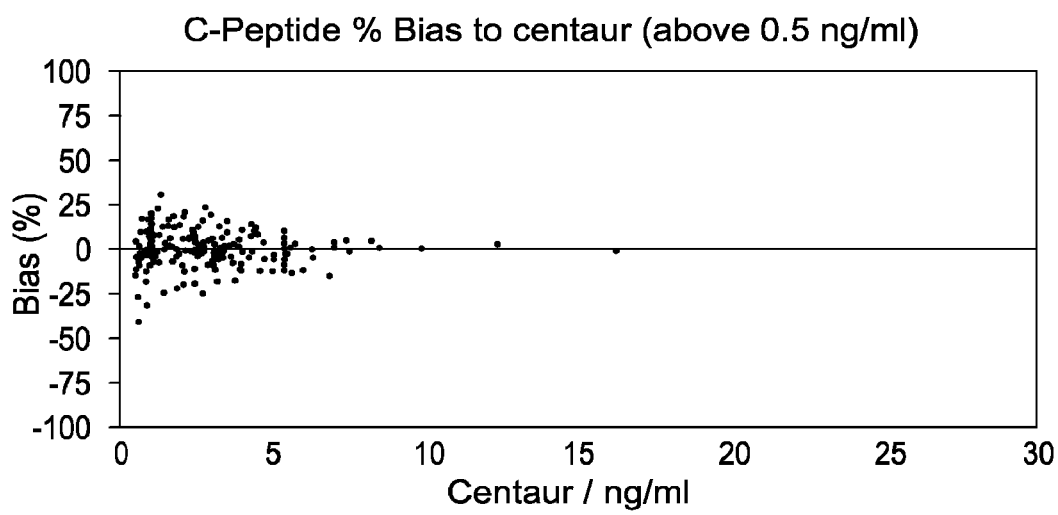
Figure 10:
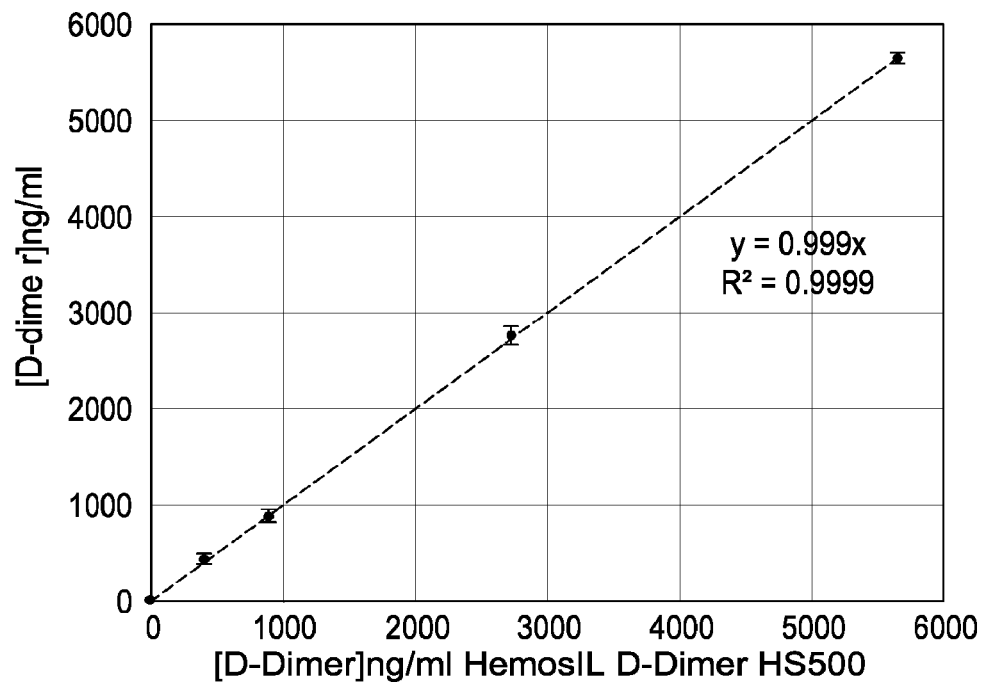
Figure 11:
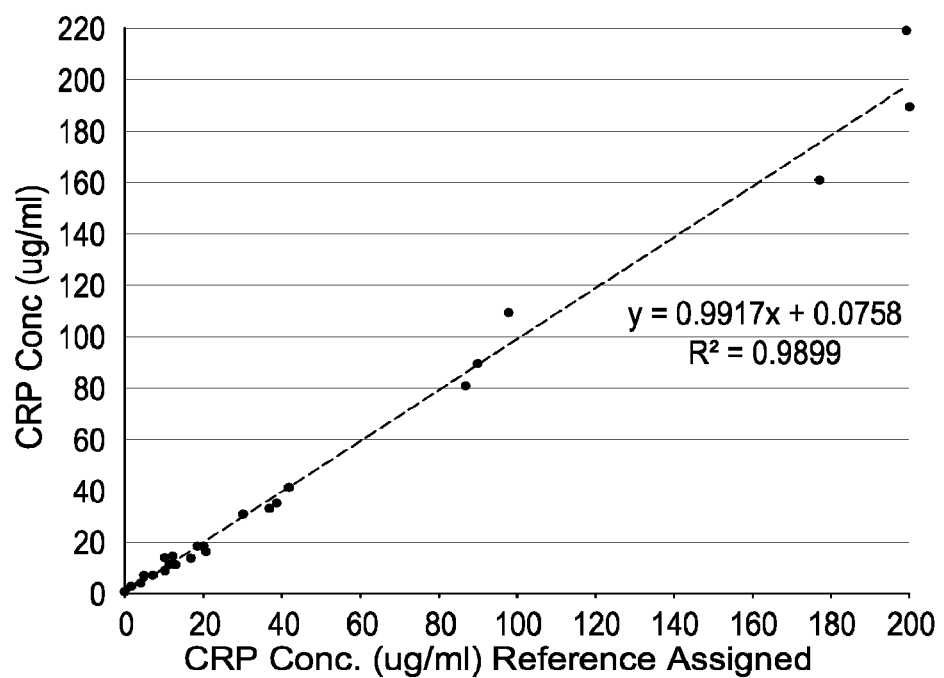
Figure 12:
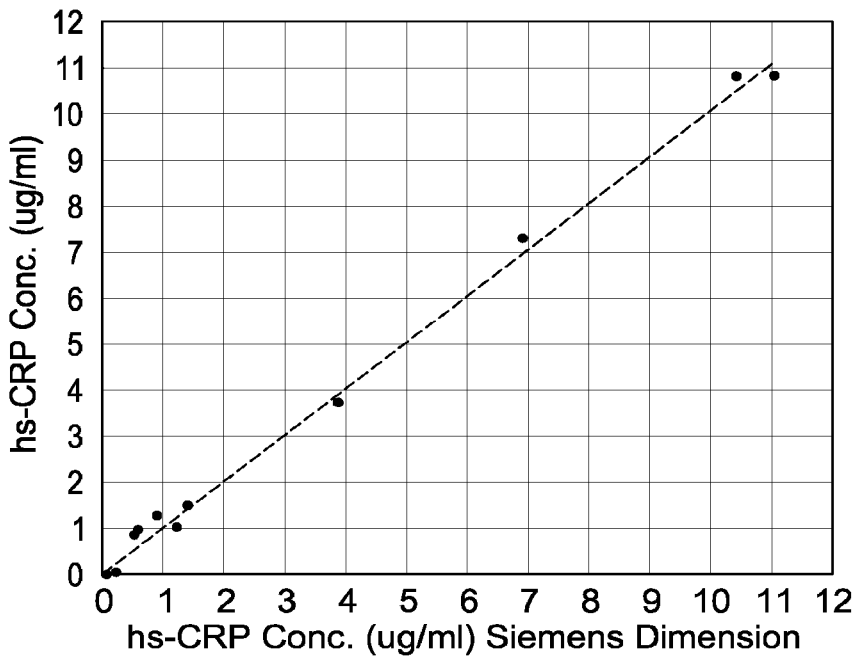
Figure 13:
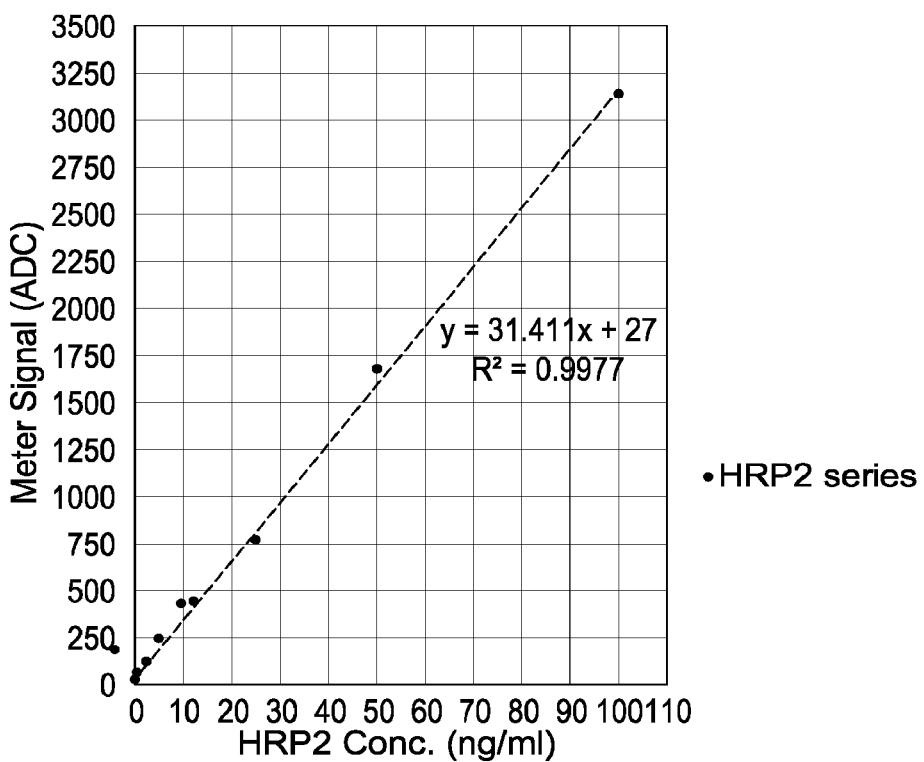
Figure 14:
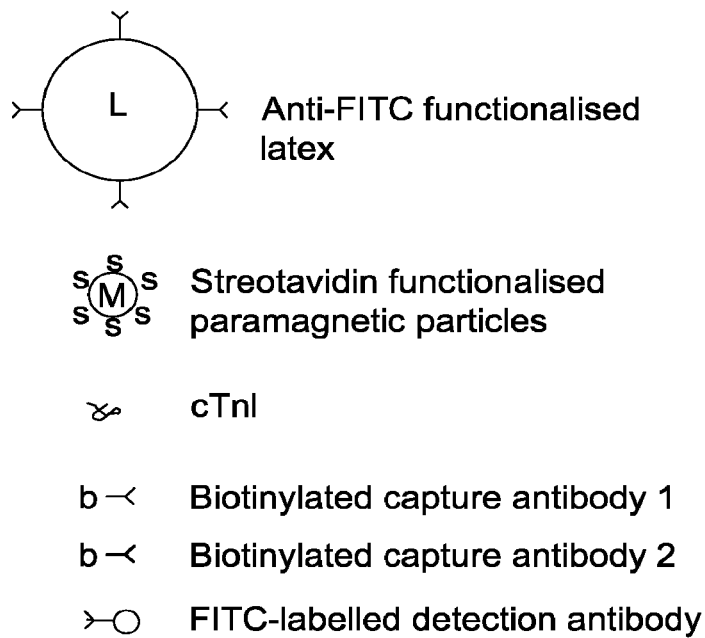
Figure 15:
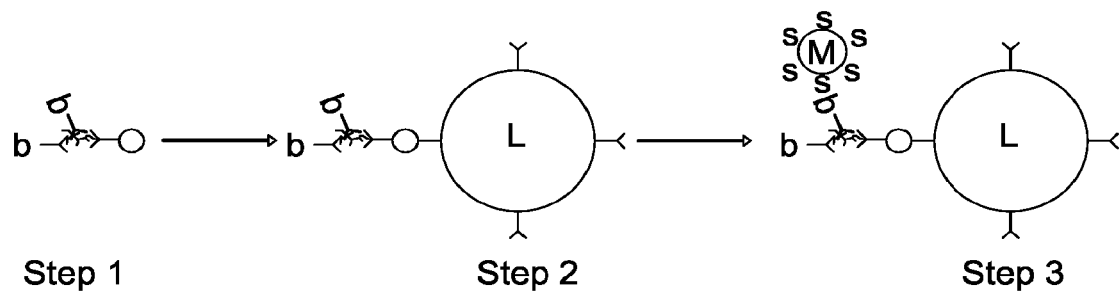
Figure 16A:
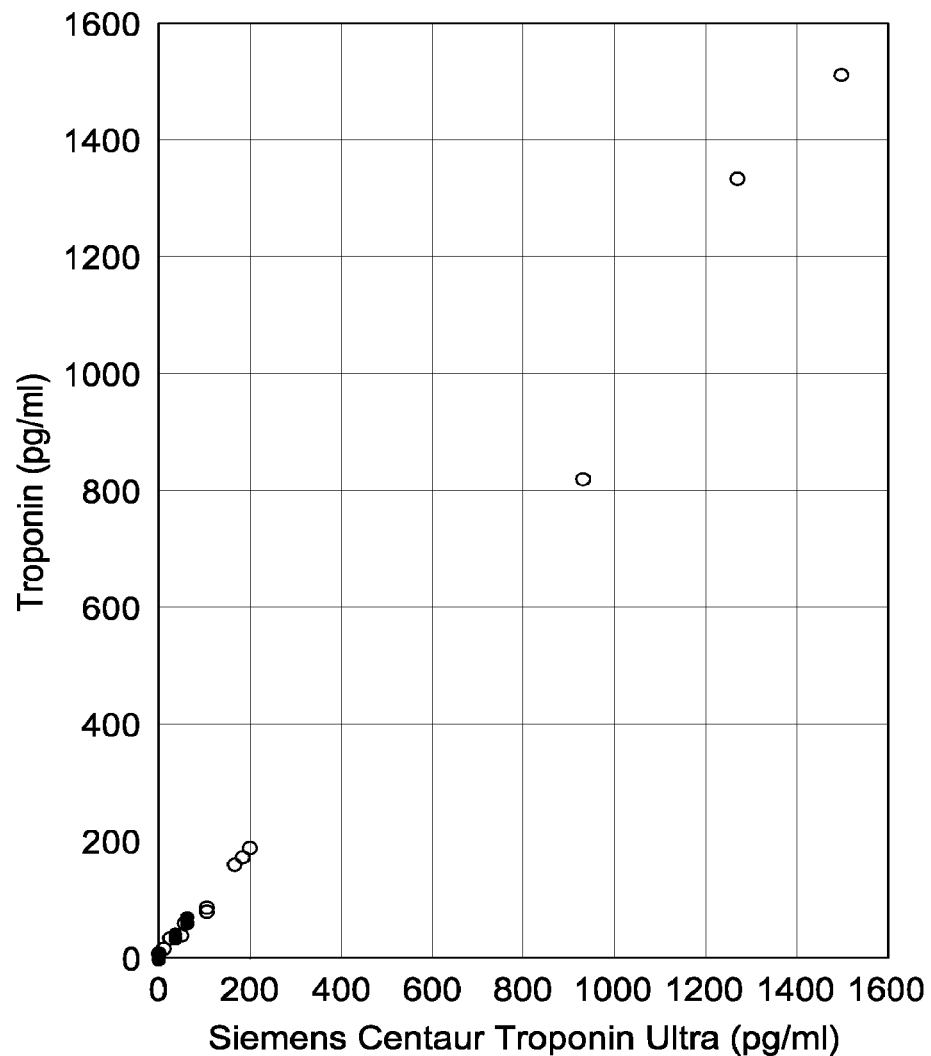
Figure 17:
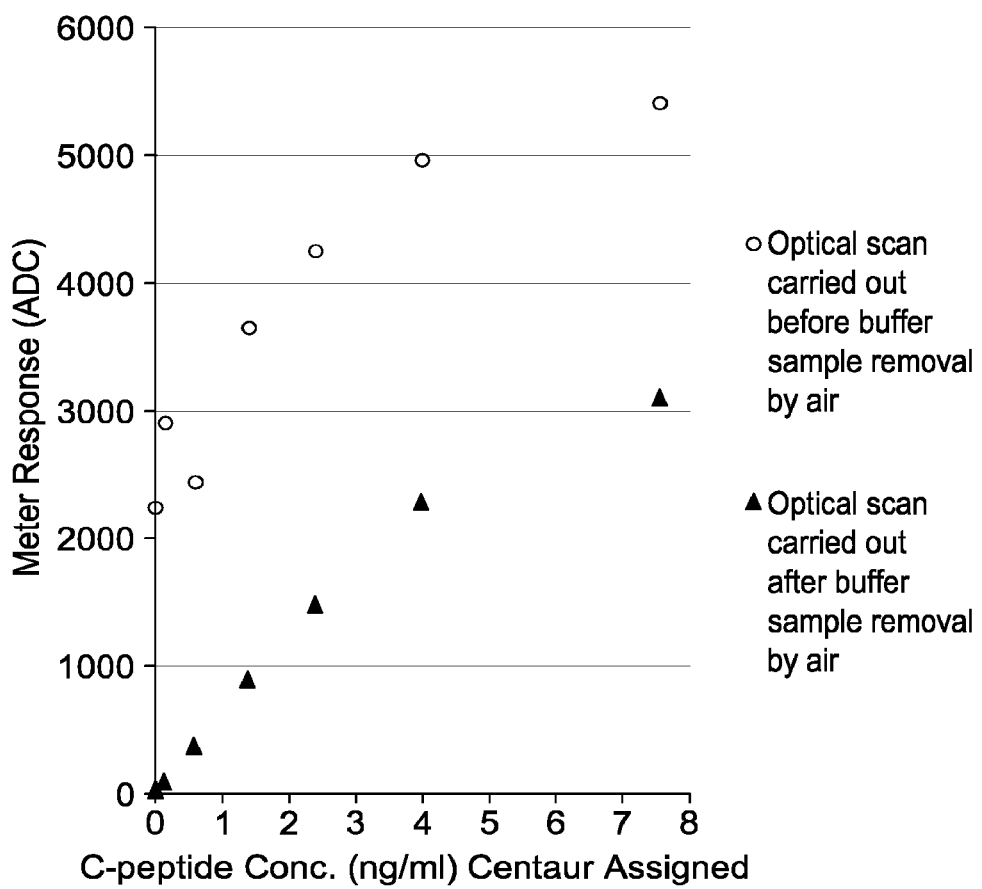
Figure 18:
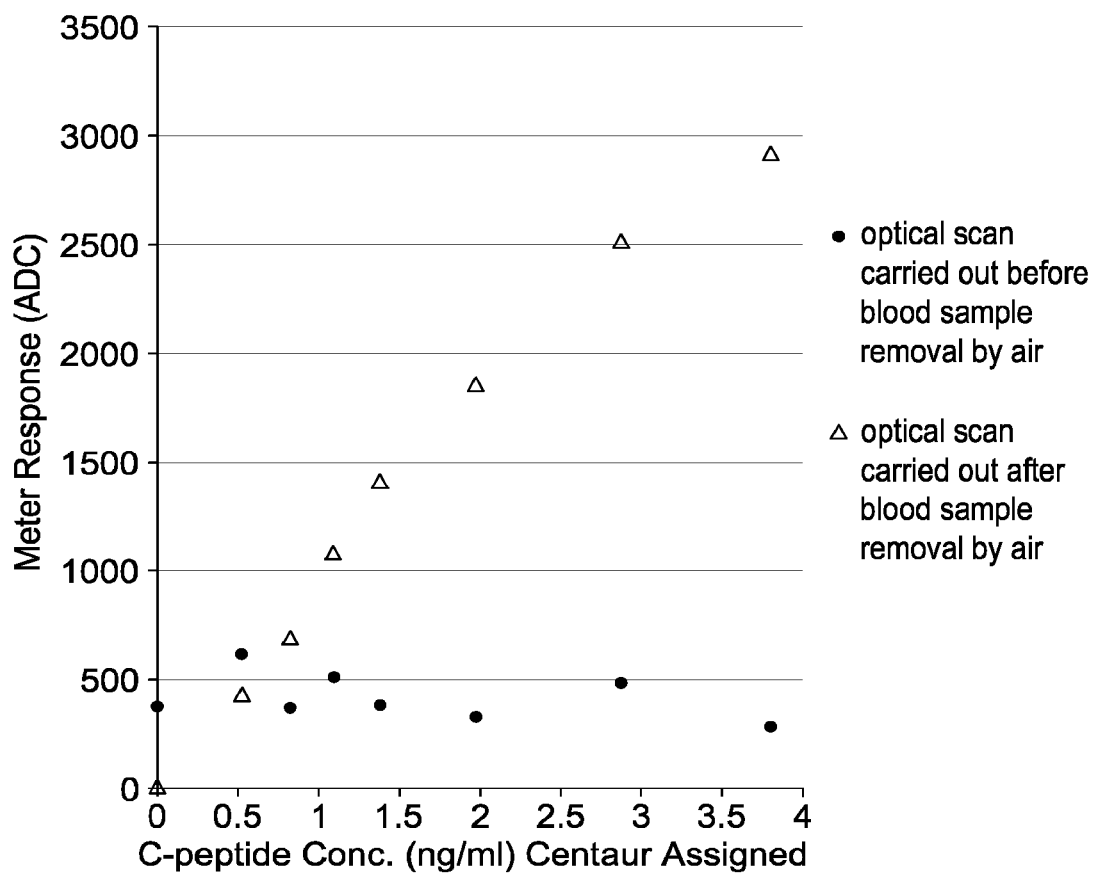
Figure 19:
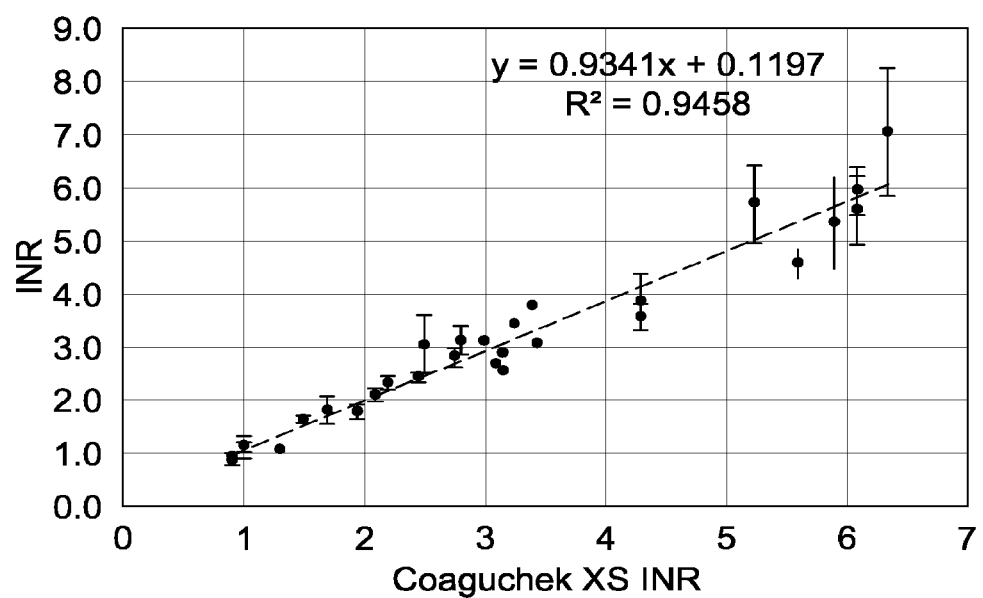

FIG. 7: shows schematics of the exemplary cartridge formats which are capable of running different numbers of assays per cartridge;

FIG. 8: shows a comparison plot detecting C-peptide in accordance with the present invention and Siemens Centaur C-peptide assay. N=350;

FIG. 9: shows a bias plot comparison detecting C-peptide in accordance with the present invention vs. Siemens Centaur C-peptide assay. N=294;

FIG. 10: shows a comparison plot detecting D-Dimer in accordance with the present invention and the HemoIL D-Dimer HS 500 clinical analyser test;

FIG. 11: shows a comparison plot detecting CRP in accordance with the present invention and the Siemens Dimension CRP clinical analyser test;

FIG. 12: shows a comparison plot detecting hsCRP in accordance with the present invention and the Siemens Dimension hsCRP clinical analyser test;

FIG. 13: shows a dose response curve of *Plasmodium falciparum* (P. f) HRP2 analyte spiked into blood and run according to the present invention;

FIG. 14: shows a schematic of reagents used in a multi-step troponin I assay;

FIG. 15: shows a schematic representation of the steps involved in a multi-step troponin I assay;

FIGS. 16(a) and (b): show plots of Troponin I measured in healthy individuals using a multi-step assay according to the present invention as compared to the Siemens Centaur troponin Ultra test;

FIG. 17 shows a comparison of a C-peptide assay response conducted in accordance with the present invention before and after buffer removal by air;

FIG. 18 shows a comparison of a C-peptide assay response conducted in accordance with the present invention on a sample of blood, before and after removal of the liquid sample by air; and FIG. 19 shows a method comparison plot using a cartridge of the present invention which comprises a channel without a gas chamber to control liquid filling and/or removal, in order to carry out an INR test and the Roche CoaguCheck INR test.

Figure 1:
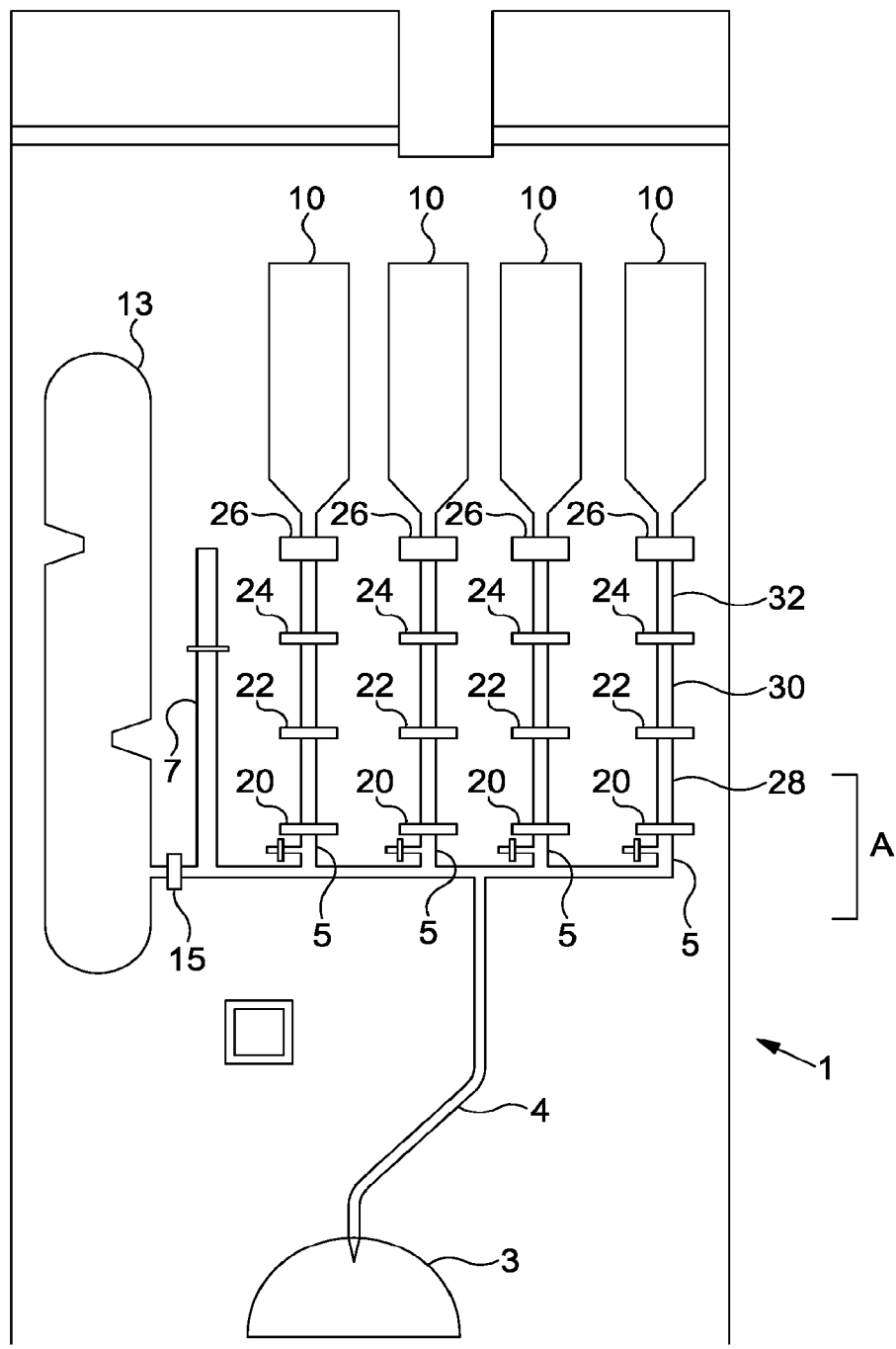
FIG. 1 shows a microfluidic cartridge in accordance with the present invention.

FIG. 1 shows a microfluidic cartridge (1) in accordance with the present invention, for carrying out 4 separate assays from a single sample. The cartridge (1) comprises a liquid sample input port (3) connected to a microfluidic channel (4) which splits into a plurality of separate channels (5 and 7). Each channel (5) extends within the cartridge (1) and is fluidly connected to gas filled chambers (10). The further channel (7) which is not connected to a gas filled chamber is a control channel for use in multiple control measurements. In use, a fluid sample fills the channels (5 and 7) and this can be detected by electrodes (not shown) which are in electrical contact with corresponding electrical contacts within the reader. Upon the reader detecting an appropriate signal that a sample has been loaded into the cartridge (1) the reader can start the assays. There is also provided a sink (13) for receiving liquid. Immediately upstream of the sink there is a liquid stop (15) which prevents liquid from entering the sink immediately (13) by capillary action alone. Thus, on initial sample application using a capillary application, the liquid sample does not pass the liquid stop (15)

Figure 2:
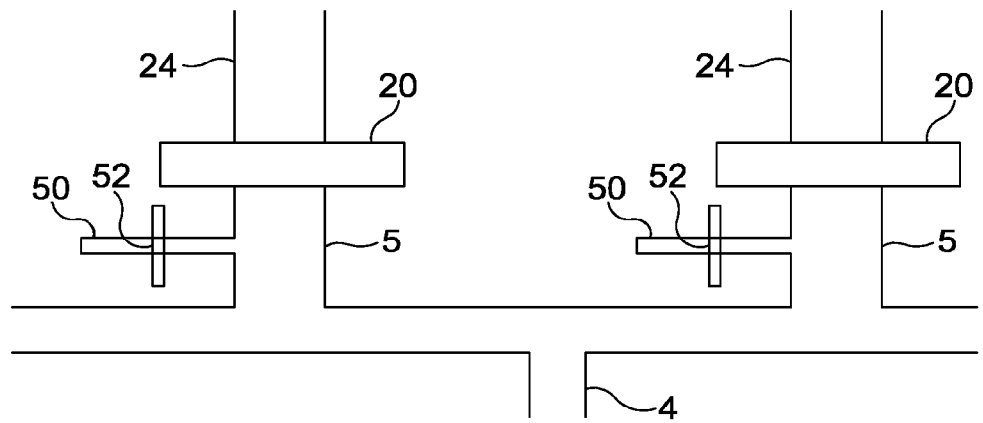
FIG. 2 shows in detail portion A as identified in FIG. 1.

Describing each channel (5) in more detail, there are printed features (20, 22, 24, 26) which are designed to limit movement of any reagent which is deposited within each channel (5) during the manufacturing process. Adjacent the printed feature (20) and represented by section A, as shown in more detail in FIG. 2, is a smaller dimensioned channel (e.g. 0.1-0.2 mm) (50) extending perpendicularly away from assay channel (e.g. 0.75-1 mm) (5). Within each channel (50) is a one way valve (0.1 mm by 0.9 mm) (52) which is designed to permit gas or air present with each channel (5) to exit the cartridge (1) upon application of a liquid sample. Thus, upon application of a sample to the cartridge by a capillary application, the sample fills the channel (4) displacing air which is present in the channels (5) which exits the cartridge through the one way valves (52). The sample fills by capillary action until the sample is approximately adjacent to each side channel (50). Located above the printed feature (20) is a first reaction zone (28) of each assay channel (5) into which has been deposited one or more binding and/or reaction agents designed to react with and bind a particular analyte or reaction product thereof which may be present in a liquid sample to be assayed. For example deposited in the first zones (28) of said channels (5) may be magnetic particles functionalised with an antibody designed to specifically bind a first epitope of an analyte to be detected. Deposited with a second zone (30) of each channel may be fluorescently labelled latex particles functionalised with a further antibody designed to specifically bind a different epitope of analyte to be detected. Located distal/proximal to zones (28, 30) is a detection zone (32) where label/analyte/magnetic particle complexes can be detected.

Located distal/proximal the detection zones (32) are the gas filled chambers (10), which are designed to collocate with a force application feature present within a reader device (as will be described later) of the present invention, so that the force application feature is capable of applying a force to the gas filled chambers (10) so as to cause gas within the chambers (10) to be expelled from the chambers (10) and into the assay channels (5). A decrease in the applied force to the chambers (10) causes air to be drawn back into the chambers (10) from the assay channels (5).

Figure 3:
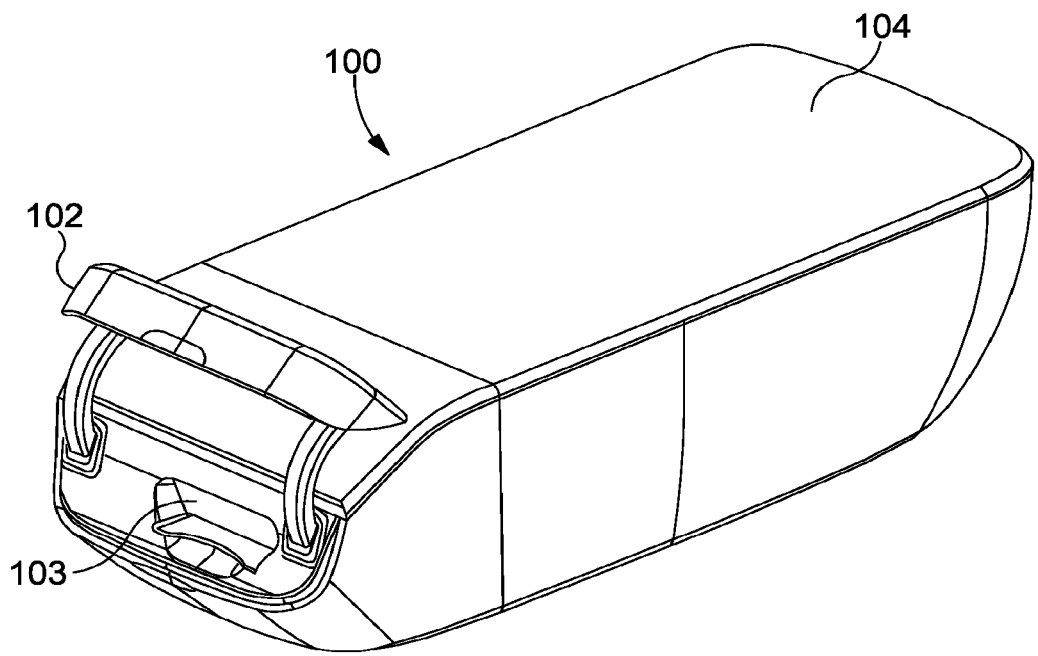
FIG. 3 shows a reader in accordance with the present invention.

In use, the cartridge (1) is inserted into a reader (100) as shown in FIG. 3. The reader has a closeable door (102), which may be opened in order to access a cartridge receiving port (103) of the reader. Once a cartridge has been inserted into the reader (100) and a sample applied to the cartridge (1), the door (102) may be closed. The reader houses a number of features which are designed to contact the cartridge (1) and/or facilitate with carrying out the assay of the present invention as will be described in more detail. The top surface of the reader (100) comprises a touch screen display (104) which allows a user to interact with the reader (100), as well as to receive information regarding the performance of any assays.

Figure 4:
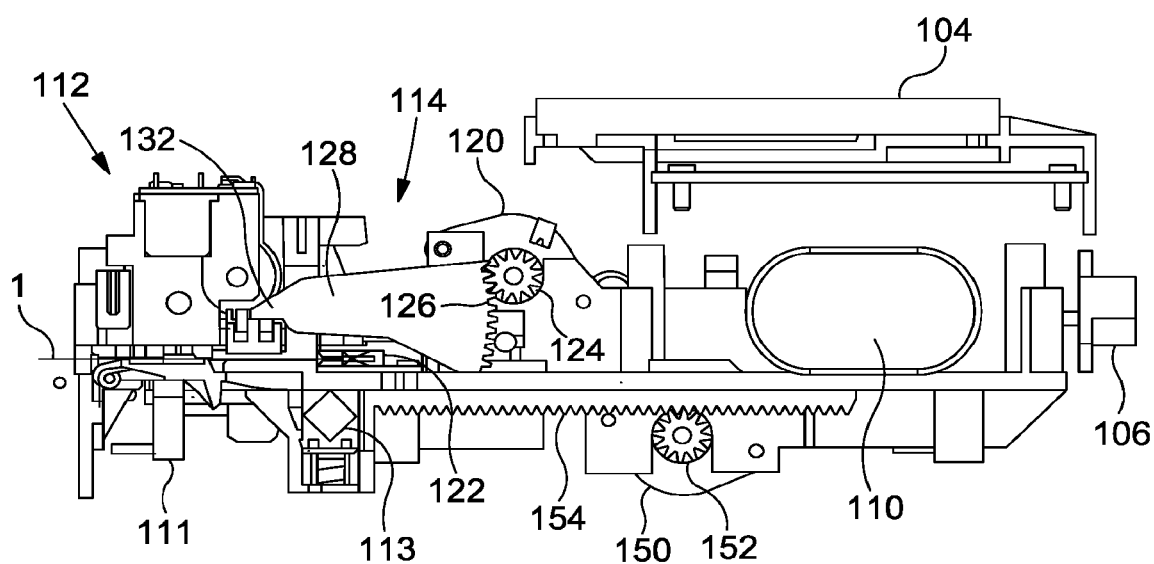
FIG. 4 shows the internal mechanisms of the reader shown in FIG. 3.

FIG. 4 shows the internal features of the reader (100). The reader includes a rechargeable battery (110) for powering the reader and its various functions as will be described. Power to charge the battery (110) is provided via a DC jack (106). The reader (100) further includes a heater (111) for heating the cartridge (1) when required; optics block (112) containing the necessary optics for detecting a fluorescent signal from the cartridge (1); a movable magnet (113) which is designed to immobilise magnetic particles within the detection zone (32) of the cartridge; and a lever mechanism (114) which is designed to contact the chambers (10) of the cartridge (1) and apply a force so as to cause air to be expelled from the chambers (10).

In use, a cartridge (1) is inserted into the reader (100) until the cartridge contacts an alignment feature (122) within the reader (100). Correct insertion of the cartridge (1) is detected by electrodes which are present on the cartridge with corresponding contacts which are present in the reader. This signals to the reader that a cartridge (1) has been correctly inserted and the start of an assay process may be commenced. A motor (120) is signaled to activate a rack and pinion mechanism. The gear (124) is turned in a clockwise direction so as to cause a rack mechanism (126) of a lever (128) to move vertically upwards. This movement causes the other end (132) of the lever (128), in the form of a finger, to move downwards and into contact with chambers (10) of the cartridge (1). Continued functioning of the motor causes the rack mechanism (126) upwards, with a corresponding downward movement of the other end (132) of the lever (128), such that an increasing force is applied to the chambers (10) of the cartridge (1), expelling gas from the chambers (10). Once the desired amount of gas has been expelled from the chambers (10), the end (132) of the lever (128) remains in contact with the gas filled chambers (10) in order to prevent gas from being drawn back into the chambers (10). At this point the user will be advised by a message on the display (104) that a sample may now be applied to the cartridge (1).

A sample is contacted with and introduced into the cartridge (1) by way of the input port (3). The sample fills the channels (4, 5, and 7) by capillary action, as previously described, with air being vented through valves (52). Following capillary filling, a portion of the liquid sample is electrically detected in channels (5 and 7), signaling the reader to continue. The motor is then induced to turn the gear mechanism (124) in an anti-clockwise direction which in turn causes the rack mechanism (126) in a downwards direction and the other end (132) of the lever (128) upwards, such that the force as applied to the chambers (10) of the cartridge (1) is reduced. This reduction in force as applied to the chambers (10) causes air to be drawn back into the chambers (10), which in turn draws the sample into the first zones (28) of the channels (5). The motor (120) and associated lever movement are able to carefully control the reduction in force applied to the chambers (10) which controls how far the liquid sample is drawn into the first zones (28). This can also be controlled via electrode sensed feedback. The liquid sample entering the first zones (28) of the channels (5) causes functionally derivatised magnetic particles present in the first zone (28) to be resuspended by the sample. The motor (120) is stopped for a period of time in order to allow any desired analyte which may be present in the liquid sample to bind to the functional analyte binding moieties on the surface of the magnetic particles in order to form analyte/magnetic particle complexes. After a defined period of time, the motor is activated again and a further reduction in force is applied to the chambers (10) causing more air to be drawn back into the chambers (10), which in turn draws the sample and analyte/magnetic particle complexes into the second zone (30) of the channels (5). The second zone (30) of each channel (5) contains functionally derivatised fluorescently labelled latex particles which are capable of binding to the analyte/magnetic particle complexes in order to form a latex particle/analyte/magnetic particle complex sandwich. After a further period of time the force applied to the chambers (10) is further reduced and the liquid and associated complexes present therein, is drawn into a detection zone (32).

Once the liquid sample and associated complexes have been drawn into the detection zone (32), the magnet (113) is driven by a motor (150) and associated gear (152) and rack (154) such that the magnet is brought into close proximity with the detection zones (32) of the cartridge, such that the magnetic complexes are attracted to the magnet and held in place within the detection zone (32) by the magnetic force of the magnet (113). Thereafter the motor (120) is reapplied so as to cause the lever mechanism (114) to increase the force applied to the gas filled chambers (10) causing air to be expelled once more from the chambers (10) which results in the liquid sample and non-magnetically bound material which is present in the detection zone (32) to be pushed away from the detection zone (32) and along the channel (5) with a portion of the liquid exiting into the sink (13). It may not be necessary to expel all of the liquid into the sink (13) and in fact it may only be necessary to remove the liquid from the detection zone (32), such that the resulting magnetically bound complexes are present in an essentially air environment. This can be particularly advantageous in terms of not using extra sample volume to perform a wash as occurs in lateral flow products and no requirement for an on-strip buffer pouch or in-meter buffer delivery system.

The motor (120) is capable of operating at a variable speed and so it is readily possible for the drawing of air into the chambers (10) and the expelling of air from the chambers (10) to occur at different rates, with a corresponding variable flow rate of the liquid present in the channel (5) and associated zones (28, 30 and 32).

Following removal of the liquid from the detection zones (32), the captured complexes are present in an essentially liquid free environment and may be detected using a detector which is present in the optical block (112). The detector may be in the form of a spectrophotometer, for example, which is capable of detecting the fluorescent label present on the captured latex particle/analyte/magnetic particle complexes.

Figure 5:
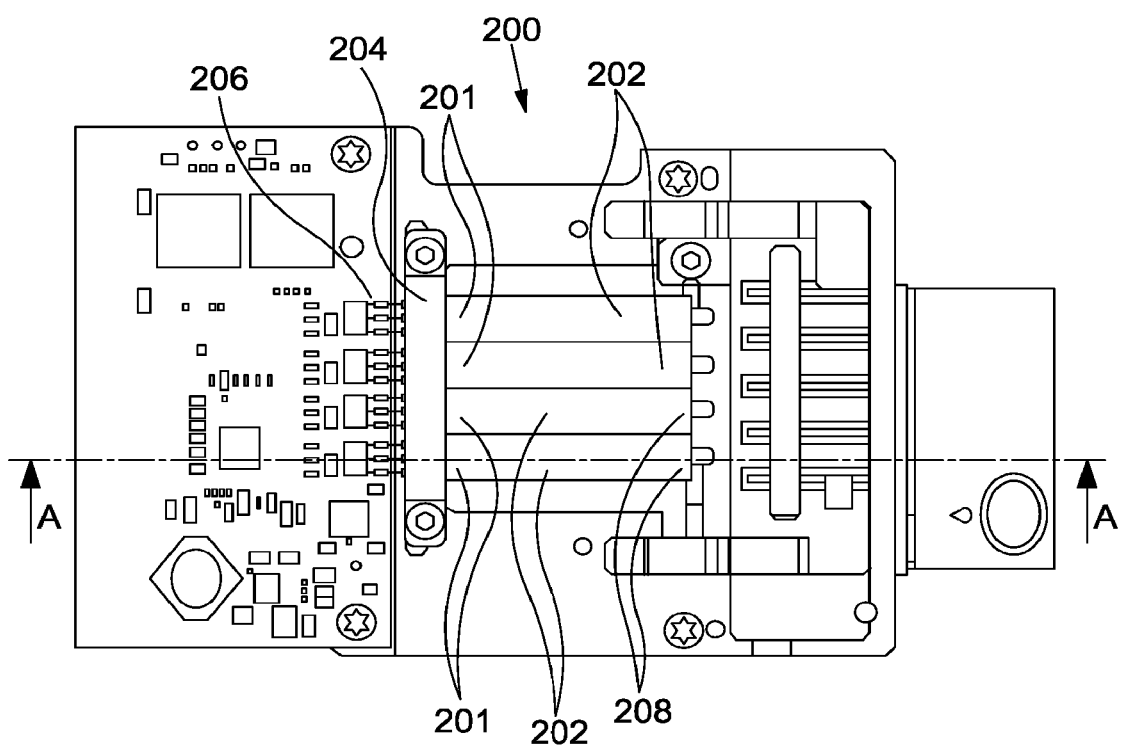
FIG. 5 shows inplan view an internal portion of a reader comprising a force control means of the invention.
Figure 6:
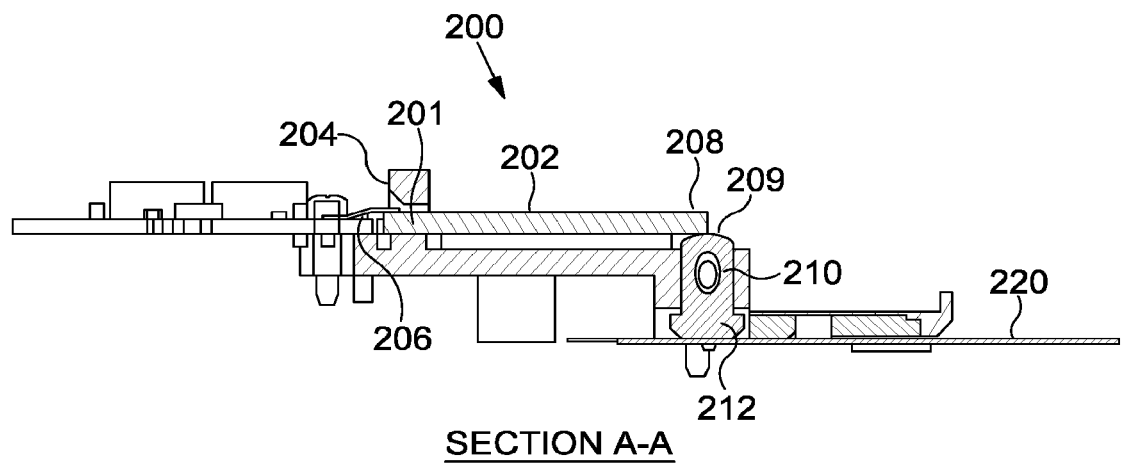
FIG. 6 shows a sectional view along line A-A of FIG. 5.

In an alternative embodiment to that shown and described in relation to FIG. 4, piezoelectric benders may be employed to control force as applied to the gas filled chambers of the cartridge. FIG. 5 shows a force control means (200). The force control means (200) comprises a series of piezoelectric benders (202) which are fixed at a first end (201) by a fixing block (204). Each piezoelectric bender is also electrically coupled at the first end to electrical connections (206) which control the electrical signal provided to each bender (202). As can be seen each bender (202) is connected to its own set of electrical connections (206), such that each bender is independently controllable. As shown in FIG. 6, the other end (208) of each bender (202) rests upon the top surface (209) of a foot (210) which in use is designed to contact the external surface of a gas chamber of a microfluidic cartridge (220) of the present invention.

FIG. 6 shows a sectional view along line A-A of FIG. 5 so the various parts of the force control means (200) and how they function can be better understood. In FIG. 6 the force control means (200) is shown together with a microfluidic cartridge (220) when correctly inserted within the reader such that the gas filled chamber of the microfluidic cartridge is directly positioned below the foot (210) of the force control means (200). The bottom surface (212) of the foot (210) is shaped to contact a portion of the gas chamber of the microfluidic cartridge (220) and through appropriate control being applied to the foot (210) by the piezo bender (202), the foot (210) is capable of applying a variable force to the gas chamber of the microfluidic cartridge (220).

As shown in FIG. 6, the piezo bender (202) is in its non-formed rigid state. In this embodiment, the force control means (200) is constructed such that the piezo bender (202) is able to extend maximum force upon the foot (210), such that the bottom surface (212) of the foot (210) pushes downwards and compresses the gas filled chamber, causing the gas within the chamber to be expelled from the chamber.

Although not shown, applying an electrical charge to the piezo bender (202) will cause piezo bender (202) to bend and the end (208) of the piezo bender (202) to bend upwards. This upward bending of the piezo bender (202) reduces the force as applied to the foot (210), which in turn causes the foot (210) to reduce the force as applied to the gas filled chamber of the cartridge (220). Reduction of the force as applied to the gas filled chamber, provides a decompression to the gas filled chamber and a corresponding ingress of gas back into the chamber. Through appropriate electrical signaling it is possible to bend and relax the piezo bender (202) resulting in the gas filled chamber being decompressed or compressed accordingly and gas being expelled or drawn into the chamber.

Many piezobenders are known in the art and may be suitable for use in the present invention. The skilled addressee will choose a bender which is suitable for a particular purpose. The present inventors have employed a variety of such piezobenders with displacement of up to several millimeters and response times in the millisecond range. A voltage programmable amplifier can be used to control each piezobender. Suitable amplifier include a 32-channel, 14-Bit DAC with Full Scale Output voltage programmable from 50V to 200V (AD5535) or High Voltage Quad-Channel 12-Bit voltage output DAC (AD5504) available from Analog Devices (Norwood, MA 02062, USA). Forces of 1N-2N may be attainable.

The above provides a description of specific embodiments of the present invention, but the present invention is designed to be in the form of a platform which can easily be adapted. For example, the vent position can be changed to allow capillary fill to different positions within the channel (5), or a vent omitted altogether and sample filling taking place by an active fill following gas being expelled from the chamber (10) and the sample by drawn into the cartridge (1) and channels (5,7) by air returning to the gas chambers following a release in pressure being applied to the chambers (10)

Moreover, the reader may be designed to utilise multiple test formats with a family of strip sizes defined by the product requirements. The strip may be designed to be manufactured in 2, 4, and 10 channel formats, for example, for specific product configurations and panel tests (see FIG. 5 showing different strip sizes). The availability of different strip sizes allows the present system to deliver multiplexed tests across mixed technologies to meet the specific user requirements of the Point of Care market at an increased performance and reduced cost structure as compared to established products in targeted markets.

With reference to FIG. 7 showing different size strips, the 2 channel cartridge is designed for single assays with controls, the 4 channel cartridge for panels of 2-3 analytes with controls and the 10 channel cartridge allows complex assays of mixed technologies and products that require high multiplexing capability (e.g. Drugs of Abuse) to be performed. The described platform has a highly flexible sample and assay architecture and reader control and measurement capability allowing forward compatibility for new opportunities to be exploited as new test panels or test types are identified or move to Point of Care.

Although the primary measurement technology is fluorescence the platform also incorporates electrochemical measurement and other methodologies can easily be incorporated. This is discussed in further detail below.

To deliver multiple test types and formats on a single platform, a set of flexible core technology capabilities and controls have been developed which can be used as required and in sequences that deliver the different assay format steps. The system architecture design principles are:

Magnetic Particle Capture Phase
Liquid movement control
Liquid removal from the detection zone
Label Detection in air
Multi-Channel Multiplexing
Intra-channel Multiplexing
Dynamic Range
On-board Controls
Electrochemical Measurements
Heating and Temperature Control
Sample Pre-treatment This platform architecture allows the many different test types and technologies to be formatted on the system. Each technology core principle is discussed below.

Magnetic Particle Capture and Liquid Control

The use of particle capture is known to improve capture kinetics. For immunoassays, the platform of the present invention uses paramagnetic particles as the capture surface. Different paramagnetic particle sizes can be used to optimise performance of each test type. Paramagnetic particles ranging from 100 to 1000 nm have been utilised during assay development. The particle capture phase is combined with a fluorescent particle label phase. Similarly, the fluorescent particle phase can be varied in size depending on the assay sensitivity and range requirements. Typical sizes of the fluorescent particles may be in the range 40 nm-4000 nm Some assays, such as C-reactive protein (CRP), require relatively high concentrations of analyte to be measured and utilise direct fluorophore labelled antibody conjugate in combination with magnetic particles, whilst high sensitivity assays generally utilise fluorescent particle labels in combination with magnetic particles. Importantly, both capture and label phases are mobile in the sample to drive capture events. This is further helped by the fact that unwanted flow within the strip is minimised. During channel filling, the sample flows over the dried test reagents. The reagent dissolution and therefore flow front effects are minimised by using formulations that allow good channel filling but result in controlled slower dissolution. After the initial sample fill event, the flow is stopped such that the sample is prevented from flowing further for a period of time. This allows very consistent dissolution and subsequent binding efficiency to occur since there are no matrix dependent flow rate errors affecting the interrogated sample volume or binding kinetics.

Performing the reagent dissolution and analyte capture in a optionally mixed, static, fixed volume as opposed to a variable flowing system (e.g. Lateral flow, Triage) significantly improves assay precision and accuracy.

For more complex assays, such as Troponin (as described elsewhere), the assay is more efficiently performed as a multistep procedure using multiple reagent zones. In this case, the meter functionality of being able to compress the gas chambers (10) to expel gas and perform the liquid removal from the detection zone is also used to effect fine liquid movement control within the cartridge (1) and associated channels. Before a sample is applied to the cartridge (1), the gas filled chambers (10) are compressed by the meter expelling gas from the chambers (10) and the assay channels. The chambers (10) remain compressed by the meter during sample application and sample filling is by capillary action or entirely under gas driven fluidic control. The high-resolution motor or piezobender within the meter allows very controlled incremental release or increase of pressure on the gas chambers (10) with the rate and amount of pressure change specific to a particular test. This feature provides a number of important advantages including the ability to of mixing using fine positive and negative bending of any piezobenders.

Sample fill time can have a significant effect on performance of a product by introducing variability of reagent dissolution, fluid front effects and the volume of sample interrogated. The fluidic control reduces the variation in fill time by directly controlling the sample fill rate. Fluidic control allows the sample to be moved in a controlled time to different zones within each channel, allowing sample pre-treatments and multi-step assays to be performed (described herein). Fluidic control and isolation is also a necessity for closed systems as required for NAT assays (see below).

Liquid Removal from the Detection Zone

Liquid movement and control is achieved by compressing or releasing the gas chambers (10) on the test cartridge using a motor and force applicator, or piezoelectric bender mechanism which contacts the fluid chambers (10). The resulting gas movement from each chamber (10) allows fine control of movement of sample and reagents including removal of unbound label from the detection zone (32) of the test channel and optionally into the sink area (13).

The embedded fluid control function within each cartridge brings a number of important differentiating advantages.

Firstly, the described system provides a very effective separation of bound and unbound assay components using gas control of liquid movement. This is important because it completely avoids the complexity and cost of an on-strip liquid reagent pouch or in-meter replaceable liquid wash reagent packs.

Secondly, the present invention further enables the use of laminate manufacturing technology with very low cartridge costs and manufacturability using high throughput, high control web production systems.

Thirdly, the removal of the sample and the unbound label from the detection zone (32) by the use of gas means the measurement of fluorescent labels can be made in an essentially liquid free, gas environment.

Label Detection in Air

Label measurement in gas results in several significant technical advantages for making fluorescent measurements compared to standard assay protocols of prior art products.

Figure 16B:
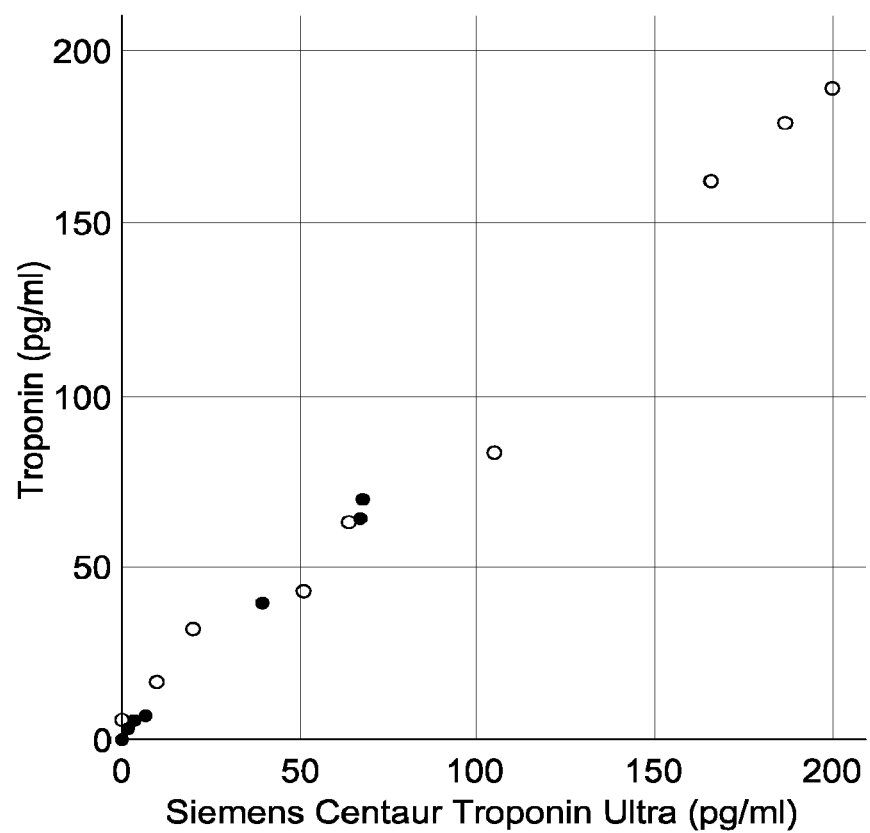

Use of an essentially gas environment significantly decreases the quenching effect of a liquid sample thereby removing a primary source of assay variation and matrix effect. For example, the presence of blood cells and plasma proteins quenches the fluorescence signal reducing the sensitivity and increasing the variability of the fluorescence measurement. The measurement of fluorophores in gas or air environment enables the use of fluorophores that would not necessarily have been chosen due to sample quenching. This allows simpler optical designs, optimisation of fluorophores for each assay and multiplexing within a single channel. As described by example below and with reference to FIGS. 15 and 16, detection in air provides a significant improvement in sensitivity as compared to detection in buffer or whole blood.

In summary, the use of gas to remove the sample and unbound label approach reduces assay variation by decreasing sample matrix quenching effects and gives access to a greater range of fluorophores for assay optimisation. This translates into assay design flexibility, speed of assay and unrivalled performance.

Multi-Channel Multiplexing

The platform of the present invention has multi-channel and intra-channel multiplexing capability. Panel tests may be delivered via multiple channels within a single strip combined with a scanning optical head to measure the label, e.g. fluorescence intensity in each channel. The number of channels can be varied depending on the product requirements.

This allows the development of panel tests with each channel containing a different assay e.g. cardiac panel, metabolic panel, etc. As individual assays are spatially distinct within separate channels, each assay can be configured with unique reagents within the multi-channel strip. This brings a number of key advantages:

Firstly, each assay can use an optimal formulation including reagents, buffers, pH etc. for: dissolution of reagents, anti-coagulation, neutralisation of matrix effects (HAMA etc.), optimum sensitivity, linearity, range and stability of the assay. It is not necessary to find a compatible optimisation for multiple assay reagent sets or compromise assay performance in order to develop panel products. Each assay can exist within its own optimum formulation within an individual channel and maintain its respective high assay performance.

By contrast, multiplexing tests within a single channel inherently compromises performance of the individual tests as the reagent formulation has to be compatible with all assays. Individual assay requirements often conflict, for example something as fundamental as pH will significantly affect assay performance.

Multi-channel multiplexing translates into panel test design flexibility, simplicity and speed of panel assay development and maintenance of single assay performance across panels.

Secondly, the multi-channel approach allows the present platform to realise novel panel products that combine different assay technologies and different transduction methods on a single strip.

There is increasing evidence that measurement of molecule families may be advantageous over measurement of a single molecule of that family. For example, the natriuretic peptides used in congestive heart failure stratification are generally separated into BNP and NT-proBNP tests. Multi-channel multiplexing allows measurement of proBNP, BNP, NT-proBNP and other natriuretic peptide forms on one strip and avoiding antibody epitope crossover within the peptide family. By contrast, intra-channel multiplexing leads to increased non-specificity of molecule family measurements. The presently described multi-channel approach is applicable to the troponin test market whereby different troponin isoforms can be measured in separate channels to improve diagnosis of myocardial infarctions.

Intra-Channel Multiplexing

Where ratio-metric measurements are required, for example HbA1c and blood ion measurements, intra-channel multiplexing is necessary in order to achieve the most accurate assay performance. The present platform achieves this by measuring more than one fluorophore in a single channel.

The combination of multi- and intra-channel multiplexing allows for flexible and powerful product combinations with on-board controls that will improve accuracy and confidence.

Dynamic Range

The large dynamic range of an analyte to be measured can often be a limitation of assay performance. For example, a troponin test needs to be very sensitive but at the same time has to be capable of measuring high concentrations in order to monitor the changes observed in myocardial infarction patients. Dynamic range often leads to non-linearity across the required measurable range, which impacts precision and accuracy.

The multi-channel design allows challenging tests with large dynamic ranges to be split into multiple channels on the strip covering high sensitivity and high concentrations of the required measurable range in a linear manner.

For troponin (I and/or T forms), one channel could contain reagents optimised for measurement of 0-100 pg/ml whilst another channel could contain reagents optimised to measure 50-1000 pg/ml and a further channel optimised for 500-50000 pg/ml. The sensitivity and range each have their own calibration parameters with the sample concentration assigned from the confidence interval of the two results.

On-Board Controls

The present platform incorporates on-board control features to verify the validity of the test results obtained. Each test type requires unique on-board assay controls as well as several generic features. All tests can have fill-detect to ensure adequate sample application and used cartridges cannot be re-tested. Where required, the cartridge incorporates a haematocrit measurement to adjust those tests affected by haematocrit variation. Specific channel controls can be implemented to incorporate low and high controls that are used to calibrate remaining blood matrix variables and/or independently verify the test result. Depletion controls can be used to check for human anti-mouse antibodies (HAMA) or other sample dependent variables.

A microprocessor and associated software can control the timings, temperature, fluid control etc. for each particular assay, as these may have different requirements within a single cartridge.

Electrochemical Measurements

Although the primary detection methodology described is fluorescence, other optical measurements may be made and/or electrochemical measurements can also be made on the present platform to incorporate traditional electrochemical test formats (e.g. glucose test). In addition, both electrochemical and fluorescent measurements can be made on the same strip, e.g. a diabetes panel of a C-peptide fluorescent immunoassay coupled with electrochemical glucose measurement. Conventional ion selective electrode (ISE) measurement approaches to ions and blood gases can also be ported onto the present platform. The combination of optical, such as fluorescence and electrochemical transduction technologies enables provision of a wide variety of different panel tests.

Heating and Temperature Control

Temperature is a significant variable in most tests. For some assays, temperature effects can be compensated using a temperature correction algorithm. However, this is often problematic to determine for individual cartridge batches and fixed compensation can become a source of error in itself. Characterisation of temperature profiles across all process and matrix variables can significantly impact the development cycle of the product. In some products such as PT/INR and molecular tests, adequate temperature control is critical for functionality and performance of the test. The present platform allows incorporation of an integrated heating capability that provides the optimum temperature requirements for each test type. Typical operating temperatures are used for immunoassays (34° C.), PT/INR (37° C.) and nucleic acid detection (>37° C.) etc. The heating capability can be optimised to deliver a range of strip and pre-treatment controlled temperatures for maximum flexibility in test protocol.

Sample Pre-Treatment

Control of on-strip sample movement allows sample pre-treatment before the sample is presented to the assay specific reagents. This approach can be applied to immunoassays, for example, to remove interferents such as HAMA species or lipid panels to remove unwanted fractions for specific lipid measurements (e.g. HDL). The on-strip fluidic steps mimic the capabilities used by clinical analysers for optimising product performance allowing sample matrix and interferences to be rapidly resolved during product development.

Exemplary Test Descriptions and Test Data

One Step Immunoassays
Summary Test Sequence:
1. Cartridge Insertion into the reader
2. Cartridge gas chamber compression by reader
3. Sample application to the cartridge, filling by capillary action or by reader controlled filling.
4. Wetting of the cartridge fill detect electrodes determines the test start timing
5. The sample rehydrates the dried reagents which contain:
   a. anti-analyte antibody (epitope 1) functionalised paramagnetic particle phase
   b. anti-analyte antibody (epitope 2) functionalised fluorescent label/particle phase
6. The reagents mix and bind the analyte contained in the sample forming the immunoassay sandwich complex (fluorescent label/particle-analyte-paramagnetic particle).
7. The binding reaction occurs for a defined amount of time (typically 2 minutes).
8. A magnetic field is applied to the strip localised to the optical detection zone accumulating the paramagnetic particles to this location forming a particle-analyte-label complex band in each channel.
9. A liquid sample and unbound label removal step is then performed by the reader initiating a force being applied to the cartridge gas chambers. This compression force expels the gas from the gas chambers via the test channel resulting in the sample liquid and unbound fluorescent label/particles being expelled from the detection zone and optionally the channel and into the sample waste sink. The magnetic field is applied for the entirety of this step holding the paramagnetic particle-analyte-label complexes in the detection zone location by the magnetic field whilst the sample is expelled from this area.

10. The meter optical head scans across the strip and the fluorescence intensity for each channel is measured. The fluorescence intensity is proportional to the analyte concentration. Each strip batch and analyte channel is calibrated separately so the fluorescence intensity is transformed into analyte concentration.

Example Performance data sets for one step immunoassays are shown in FIGS. 8-13:

C-Peptide

C-peptide is a short 31-amino-acid polypeptide that connects insulin's A-chain to its B-chain in the pro-insulin molecule. Pro-insulin is cleaved into insulin and C-peptide in equimolar concentrations. In the context of diagnosis C-peptide is used as a surrogate biomarker for insulin and is used to monitor β-cell function (insulin production) in diabetic patients. The present inventors ran a comparison of the present assay against the commercially available ADVIA Siemens Centaur benchtop system (see FIG. 8).

Table 1 below shows the percentage of results which are within a given bias of the reference system for the C-Peptide range as indicated. This shows that the present assay achieves typically around 95% of results within 20% of the reference system.

TABLE 1

Accuracy of C-Peptide Assay

| | within 10% | within 15% | within 20% |
|---|---|---|---|
| above 0.5 ng/ml | 73.1 | 89.2 | 95.9 |
| above 0.25 ng/ml | 70.9 | 87.6 | 94.7 |
| above 0.1 ng/ml | 69.7 | 86.2 | 93.4 |

A bias analysis of the present system vs. the Siemens Centaur reference system was performed for samples above 0.5 ng/ml (294 points), this is plotted in (FIG. 9) in comparison to an established commercially available clinical analyser. The percent bias of each point to the reference system value is plotted vs. the reference value. The plot shows the present assay system has comparable clinical accuracy to an established lab system.

D-Dimer

D-dimer is a fibrin degradation product (FDP), a small protein fragment present in the blood after a blood clot is degraded by fibrinolysis. The D-dimer molecule contains two cross-linked D fragments of the fibrin protein.

D-dimer concentration is used to help diagnose thrombosis. It is an important test performed in patients with suspected thrombotic disorders. While a negative result practically rules out thrombosis, a positive result can indicate thrombosis but does not rule out other potential causes. Its main use, therefore, is to exclude thromboembolic disease where the probability is low.

The inventors carried out a dose response analysis using the presently described methodology and compared results with those from a HemoIL D-Dimer HS 500 (a commercially available clinical analyser) (see FIG. 10)

C-Reactive Protein (CRP)

C-reactive protein (CRP) is an annular (ring-shaped), pentameric protein found in blood plasma, whose levels rise in response to inflammation. It is an acute-phase protein of hepatic origin that increases following interleukin-6 secretion by macrophages and T cells.

CRP has diagnostic utility for a number of disease types which can be summarised as follows:
1. Inflammation status in type 1 diabetic patients
2. Antibiotic stewardship for infection control and general infection status
3. Cardiovascular disease
4. Certain cancers A method comparison plot is shown in FIG. 11. The reportable range required is 5-200 μg/ml.

High Sensitivity CRP (hs-CRP)

High sensitivity CRP (hs-CRP) is used in assessing the risk of developing cardiovascular disease. General guidelines are as follows:
1. Low: hs-CRP level under 1.0 mg/L
2. Average: between 1.0 and 3.0 mg/L
3. High: above 3.0 mg/L A method comparison plot is shown in FIG. 12. The data demonstrates the present platform is well capable of measuring the required concentrations of hs-CRP.

Malaria *Plasmodium falciparum* HRP2

The malaria parasite *Plasmodium falciparum* secretes the histidine-rich protein II (HRP2) used as a biomarker to detect the presence of the malaria parasite *Plasmodium falciparum* (Pf). The present platform has been used to demonstrate the measurement of HRP2 in blood samples. HRP2 protein was spiked into bloods and measured on the present platform and on Standard Diagnostics (SD) malaria Pf rapid test.

The lowest HRP2 concentration measured on the present platform was 0.25 ng/ml. In comparison, using the SD test a very faint band was observed for 5 ng/ml. Lower concentrations could not be measured. The 0.25 ng/ml present platform test result took 7 minutes verses the recommended 30 minute test time required for SD test to measure the 5 ng/ml concentration. The 30 min assay time is necessary for the competitor tests to wash out the unbound gold sol label and any lysed blood to resolve very low concentrations. There are also additional user actions to apply a buffer to the strip to perform this wash step.

The data was analysed and results are summarised in FIG. 13. The present assay was able to measure significantly lower HRP2 concentrations than the SD test with much faster test times. This assay has the sensitivity to meet the requirements for a rapid test to monitor residual infection in a population Malaria eradication program.

Multi-Step Immunoassay—e.g. Troponin

The present platform is configurable to carry out multi-step assays allowing step-wise binding reactions to occur to optimise binding kinetics, test time and sensitivity.

In the high sensitivity Troponin assay, the antibody paramagnetic particle binding steps and label/particle binding steps are dissociated to significantly improve binding rate and capture efficiency of the analyte-antibody paramagnetic particle binding step for very low concentrations of Troponin. Subsequent stepwise binding of the label particle and the paramagnetic particle using high affinity anti-fluorescein isothiocyanate and Biotin-Streptavidin functionalized particles, respectively, enable higher capture and transduction of the bound Troponin complex.

Summary Test Sequence:

1. Cartridge insertion into the reader
2. Gas chamber compression by the reader
3. Sample application to the cartridge, filling by capillary action to first vent-stop feature where first reagents are located (labelled antibodies)
4. Reagent re-solubilisation and antibody-analyte incubation and binding time.
5. A small chamber decompression results in the liquid sample being drawn further along the channel locating the sample reagent mix over a secondary reagent.
6. Reagent re-solubilisation and antibody-analyte-particle label incubation and binding time.
7. A second small chamber decompression results in the sample being moved further along the channel locating the sample reagent mix over a third reagent
8. Reagent re-solubilisation and antibody-analyte-particle label-paramagnetic particle incubation and binding time.
9. A magnetic field is applied to the cartridge localised to the optical detection zone accumulating the paramagnetic particles to this location forming an antibody-analyte-particle label-paramagnetic particle complex band in each channel.
10. Sample liquid and unbound label is removed from the detection zone by recompression of the chambers expelling the sample and unbound label from the optical detection zone
11. The reader's optical head scans across the strip and the fluorescence intensity for each channel is measured. The fluorescence intensity is proportional to the Troponin analyte concentration.

Troponin I (TnI) assay—reagents are identified in FIG. 14

Step 1: This is a passive capillary fill. The TnI assay uses two capture antibodies each of which is tagged with a biotin group. The label antibody is tagged with a Fluorescein isothiocyanate (FITC) group. The biotin groups and FITC molecule serves as immunogenic tags for the second and third step.

Step 2: The sample from step one is moved to a secondary reagent deposition area by fluidic reader control (chamber decompression). This deposition contains anti-FITC antibody coated latex particles. The anti-FITC latex particles will bind the FTIC tagged antibody (which is bound to the TnI complex). This reaction is rapid.

Step 3: The sample is moved to the third deposition zone by fluidic reader control. The third deposition area contains streptavidin coated magnetic particles. The streptavidin paramagnetic particles will rapidly bind the biotin labelled antibodies which are bound to the TnI complex. Paramagnetic particle accumulation is followed by the sample/unbound label removal. The fluorescent optical scan is then performed. The fluorescence intensity is proportional to the TnI concentration.

A schematic of the above method is shown in FIG. 15

Step 1 is capillary fill, step 2 & 3 are under reader fluid control.

This approach is very attractive since it has generic application and greatly simplifies the assay reagents plus very importantly leads to excellent assay performance (see exemplary results shown in FIGS. 16(a) and (b)), which the sensitivity of the present method over a wide concentration range. For example, the anti-FITC latex is a generic label for other assays (e.g. BNP), likewise the streptavidin paramagnetic particles are also generic between assays. Batch to batch production of reagents will become much easier for the challenging assays such as TnI.

To show the significance of carrying out optical detection, such as a fluorescent detection, in air, the inventors carried out further C-peptide assays in order to show the response when conducted in buffer or whole blood, as compared to air. FIG. 17 shows a C-peptide assay response in buffer using the present system before (white circles) and following (black triangles) following removal by air. It can be seen that without removal of liquid by air there is a high background due to unbound label still being present in the detection area. This leads to poor precision and sensitivity at low analyte concentrations. Following the removal of liquid by air, this unbound label is efficiently removed, leaving a very low background allowing a highly sensitive measurement to be made. FIG. 18 shows a C-peptide assay response in whole blood using the present system before (black circles) and following (white triangles) removal of liquid by air. It can be seen that without the removal of liquid by air there is a high background due to unbound label still being present in the detection area and no visible slope due to the interference of blood sample, quenching the fluorescent measurement. Following removal of liquid by air, this unbound label and whole blood sample is efficiently removed, leaving the binding reagents in an essentially liquid-free environment without interfering blood cells or unbound label. This produces a very low background and allows a highly sensitive measurement to be made.

It is possible for the present cartridges to also run assays which do not require a bladder to run the assay, for example, in determining the prothrombin time (PT) and international normalized ratio (INR) of a blood sample. The PT and INR are assays evaluating the extrinsic pathway of coagulation (PT/INR). They are used to determine the clotting tendency of blood, in the measure of warfarin dosage, liver damage, and vitamin K status.

A method comparison plot of the PT/INR measurement is shown in FIG. 19 which was generated using a channel which does not have any fluid control provided by a gas chamber. In this regard the sample would fill by capillary action alone. For the avoidance of doubt PT/INR measurements can also be made using a channel with an associated gas chamber, which allows fluidic control of the sample allowing normalisation of fill rates. In comparison to previously described immunoassay examples, the channel is widened in the detection area of the strip in order to permit an increased volume of sample to be assayed. In addition, the INR/PT specific reagents are deposited in this area. The reagents contain all the required components to initiate the extrinsic clotting cascade and a specific thrombin fluorophore substrate which is converted from a non-fluorescent form to a fluorescent form by thrombin. The capillary filling resuspends the reagents and permits detection of thrombin activity. The measured thrombin activity (fluorescent intensity) is used to determine the PT/INR result.

The invention claimed is:

1. A self-contained, dry, planar microfluidic cartridge for use in conducting one or more assay(s) on a liquid sample, the microfluidic cartridge comprising:
   a sample input port for receiving the liquid sample, the sample input port connected to at least one microfluidic channel at a first end of said microfluidic channel, wherein each/said microfluidic channel(s) comprises one or more reagents deposited therein for use in conducting the assay and a detection zone for use in detecting any analyte which may be present in the sample or analyte reaction product thereof; and each/said microfluidic channel(s) is further fluidly connected to compressible gas-filled chamber disposed at a second end of each/said microfluidic channel(s) downstream from each/said deposited reagents and detection zone, wherein each/said gas-filled chamber lacks any valve or port that communicates with the outside of the strip, and wherein the self-contained dry planar microfluidic cartridge does not contain liquid prior to the application of a sample and comprises three resilient planar layers, which are sandwiched together to define each/said microfluidic channel(s) and each/said gas-filled chamber(s) and wherein said gas-filled chamber(s) are configured to be compressed, thereby causing the gas-filled chamber to be deformed and gas to be expelled from the gas-filled chamber(s) and upon decompressing the gas-filled chamber(s), the gas-filled chamber(s) are configured to return to its non-deformed state, and whereby gas is configured to be drawn back into the gas-filled chamber(s), wherein said compression and decompression in turn is configured to cause reciprocal movement of the liquid sample within said/each microfluidic channel.

2. The microfluidic cartridge according to claim 1, wherein following a reaction of the liquid sample with said one or more reagents deposited within said/each microfluidic channel, gas expelled from a gas-filled chamber serves to remove liquid from the detection zone within said/each microfluidic channel, in order that any analyte or analyte reaction product within said/each detection zone can be detected in a substantially liquid free environment.

3. The microfluidic cartridge according to claim 1, comprising a plurality of microfluidic channels, wherein each of said plurality of microfluidic channels is in fluid communication with the sample input port.

4. The microfluidic cartridge according to claim 3, wherein each of said plurality of microfluidic channels is connected to a respective gas-filled chamber, and/-or two or more microfluidic channels are connected to a gas-filled chamber.

5. The microfluidic cartridge according to claim 1, wherein the three resilient planar layers comprise a top layer, a bottom layer and a middle layer disposed between the top and bottom layers.

6. The microfluidic cartridge according to claim 5, wherein the top and bottom layers are substantially uniform in thickness.

7. The microfluidic cartridge according to claim 5, wherein the middle layer comprises a pattern cut through the layer corresponding to certain features of the cartridge include including the microfluidic channel(s) and gas-filled chamber(s).

8. The microfluidic cartridge according to claim 5, wherein the planar layers are sealed together by application of heat and/or the use of adhesive.

9. The microfluidic cartridge according to claim 8, wherein the planar layers are sealed together using an adhesive which is resilient and facilitates with the compressibility of each/said gas-filled chamber.

10. The microfluidic cartridge according to claim 9 wherein the middle layer is in the form of an adhesive layer which is capable of adhering the top and bottom layers.

11. The microfluidic cartridge according to claim 1, wherein said/each microfluidic channel(s) in the cartridge comprises one or more fluid stop features, which are designed to prevent the sample and/or other fluids from passing through said stop feature(s) by virtue of capillary action alone.

12. The microfluidic cartridge according to claim 1, comprising a one-way valve which is designed only to allow gas to exit the cartridge upon a liquid sample being introduced into the cartridge by capillary action, while not permitting fluid from being introduced into the cartridge via the valve.

13. The microfluidic cartridge according to claim 12, wherein the one-way valve is positioned adjacent to a stop feature which has been designed to prevent further transport of the sample within the microfluidic channel by capillary action alone.

14. The microfluidic cartridge according to claim 1, further comprising an analyte binding agent deposited within said microfluidic channel(s).

15. The microfluidic cartridge according to claim 14, wherein the analyte binding agent is bound to a surface of one or more of said microfluidic channel(s).

16. The microfluidic cartridge according to claim 14, wherein the analyte binding agent is attached to a magnetic or paramagnetic particle.

17. The microfluidic cartridge according to claim 16, wherein the analyte binding agent or magnetic/paramagnetic particle is deposited within said/each microfluidic channel(s) of the cartridge, such that upon the liquid sample being applied to the cartridge and being drawn into said/each channel(s), the binding agent and/or magnetic/paramagnetic particle is resuspended by the liquid sample.

18. The microfluidic cartridge according to claim 1 wherein said cartridge is capable of carrying out a plurality of the same and/or different assays on a single sample.

19. The microfluidic cartridge according to claim 1, wherein the said compressible gas-filled chamber is sealed and the only opening/exit from the gas-filled chamber is via an opening with said microfluidic channel(s).

* * * * *